United States Patent
Saito et al.

(10) Patent No.: US 9,536,994 B2
(45) Date of Patent: Jan. 3, 2017

(54) METHOD FOR MANUFACTURING SEMICONDUCTOR DEVICE AND SEMICONDUCTOR DEVICE

(71) Applicant: Semiconductor Energy Laboratory Co., Ltd., Atsugi-shi, Kanagawa-ken (JP)

(72) Inventors: Toshihiko Saito, Atsugi (JP); Atsuo Isobe, Isehara (JP); Kazuya Hanaoka, Fujisawa (JP); Sho Nagamatsu, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 61 days.

(21) Appl. No.: 14/454,071

(22) Filed: Aug. 7, 2014

(65) Prior Publication Data

US 2014/0349444 A1   Nov. 27, 2014

Related U.S. Application Data

(62) Division of application No. 13/609,931, filed on Sep. 11, 2012, now Pat. No. 8,841,675.

(30) Foreign Application Priority Data

Sep. 23, 2011   (JP) ................... 2011-208240
Oct. 13, 2011   (JP) ................... 2011-225900

(51) Int. Cl.
*H01L 29/66*   (2006.01)
*H01L 29/786*   (2006.01)
(Continued)

(52) U.S. Cl.
CPC ... *H01L 29/66969* (2013.01); *H01L 21/02565* (2013.01); *H01L 21/44* (2013.01);
(Continued)

(58) Field of Classification Search
None
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2120267 A   11/2009
(Continued)

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

(Continued)

*Primary Examiner* — Matthew Reames
*Assistant Examiner* — Steven B Gauthier
(74) *Attorney, Agent, or Firm* — Robinson Intellectual Property Law Office; Eric J. Robinson

(57) ABSTRACT

A minute transistor and the method of manufacturing the minute transistor. A source electrode layer and a drain electrode layer are each formed in a corresponding opening formed in an insulating layer covering a semiconductor layer. The opening of the source electrode layer and the opening of the drain electrode layer are formed separately in two distinct steps. The source electrode layer and the drain electrode layer are formed by depositing a conductive layer over the insulating layer and in the openings, and subsequently removing the part located over the insulating layer by polishing. This manufacturing method allows for the source electrode later and the drain electrode layer to be (Continued)

formed close to each other and close to a channel forming region of the semiconductor layer. Such a structure leads to a transistor having high electrical characteristics and a high manufacturing yield even in the case of a minute structure.

25 Claims, 16 Drawing Sheets

(51) Int. Cl.
- H01L 27/12 (2006.01)
- H01L 27/146 (2006.01)
- H01L 29/04 (2006.01)
- H01L 29/78 (2006.01)
- H01L 21/02 (2006.01)
- H01L 21/44 (2006.01)
- H01L 21/463 (2006.01)
- H01L 21/465 (2006.01)

(52) U.S. Cl.
CPC .......... H01L 21/463 (2013.01); H01L 21/465 (2013.01); H01L 27/1225 (2013.01); H01L 27/14632 (2013.01); H01L 29/04 (2013.01); H01L 29/78 (2013.01); H01L 29/7869 (2013.01); H01L 27/14687 (2013.01)

(56) References Cited

U.S. PATENT DOCUMENTS

| | | |
|---|---|---|
| 6,197,682 B1 | 3/2001 | Drynan et al. |
| 6,294,274 B1 | 9/2001 | Kawazoe et al. |
| 6,403,462 B1 | 6/2002 | Hasunuma et al. |
| 6,563,174 B2 | 5/2003 | Kawasaki et al. |
| 6,720,242 B2 * | 4/2004 | Burbach ............... H01L 21/743 257/E21.538 |
| 6,727,522 B1 | 4/2004 | Kawasaki et al. |
| 6,879,049 B1 | 4/2005 | Yamamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,982,250 B2 | 7/2011 | Yamazaki et al. |
| 8,164,090 B2 | 4/2012 | Iwasaki et al. |
| 8,384,076 B2 | 2/2013 | Park et al. |
| 9,240,488 B2 | 1/2016 | Yamazaki et al. |
| 9,378,980 B2 | 6/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267099 A1 * | 11/2006 | Takano ............... H01L 27/1214 257/350 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0257316 A1 | 11/2007 | Hayakawa et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294863 A1 | 12/2009 | Han et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 * | 4/2011 | Yamazaki ........... H01L 27/0688 257/43 |
| 2011/0122670 A1 | 5/2011 | Yamazaki et al. |
| 2011/0147849 A1 | 6/2011 | Augendre et al. |
| 2011/0175152 A1 | 7/2011 | Booth, Jr. et al. |
| 2012/0306021 A1 | 12/2012 | Samavedam et al. |
| 2012/0315735 A1 | 12/2012 | Koezuka et al. |

FOREIGN PATENT DOCUMENTS

| | | |
|---|---|---|
| EP | 2175493 A | 4/2010 |
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-167795 A | 6/1997 |
| JP | 11-505377 | 5/1999 |
| JP | 2000-044236 A | 2/2000 |
| JP | 2000-049164 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-261522 A | 9/2006 |
| JP | 2007-096055 A | 4/2007 |
| JP | 2007-123861 A | 5/2007 |
| JP | 2009-094494 A | 4/2009 |
| JP | 2009-278115 A | 11/2009 |
| JP | 2010-021351 A | 1/2010 |
| JP | 2010-093070 A | 4/2010 |
| JP | 2011-146694 A | 7/2011 |
| JP | 2011-181582 A | 9/2011 |
| JP | 2011-181957 A | 9/2011 |
| WO | WO-99/38204 | 7/1999 |
| WO | WO-2004/114391 | 12/2004 |
| WO | WO-2011/074407 | 6/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employings $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of The 9th International Display Workshops, Dec. 4, 2002, pp. 295-298.

Van de Walle.C, "Hydrogen as a Cause of Doping in Zinc Oxide", (Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In-Ga-Zn-Oxide TFTs", IDW '09 : Proceedings of The 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs with a Novel Passivation Layer", SID Digest '09 : SID International Symposium Digest of Technical Papers, May 31, 2009, pp. 284-287

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and YbFe3O7 Types of Structures for Compounds in the In2O3 and Sc2O3-A2O3-Bo Systems [A: Fe, Ga, Or Al; B: Mg, Mn, Fe, Ni, Cu,OR Zn] at Temperatures Over 1000 ° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of The 6th International Displays Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

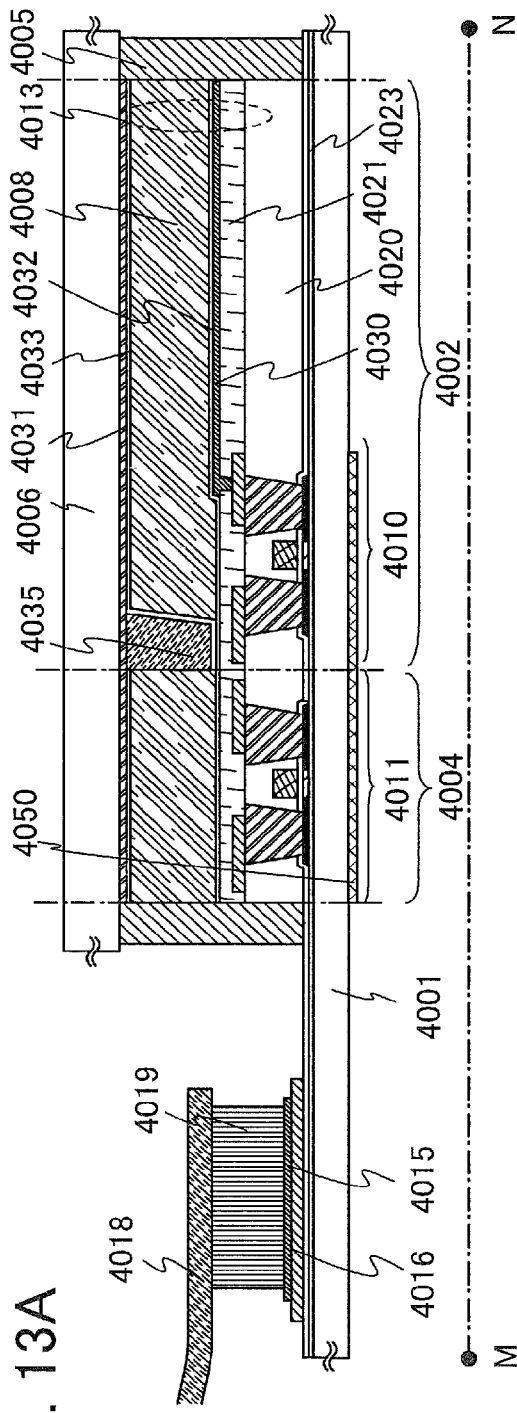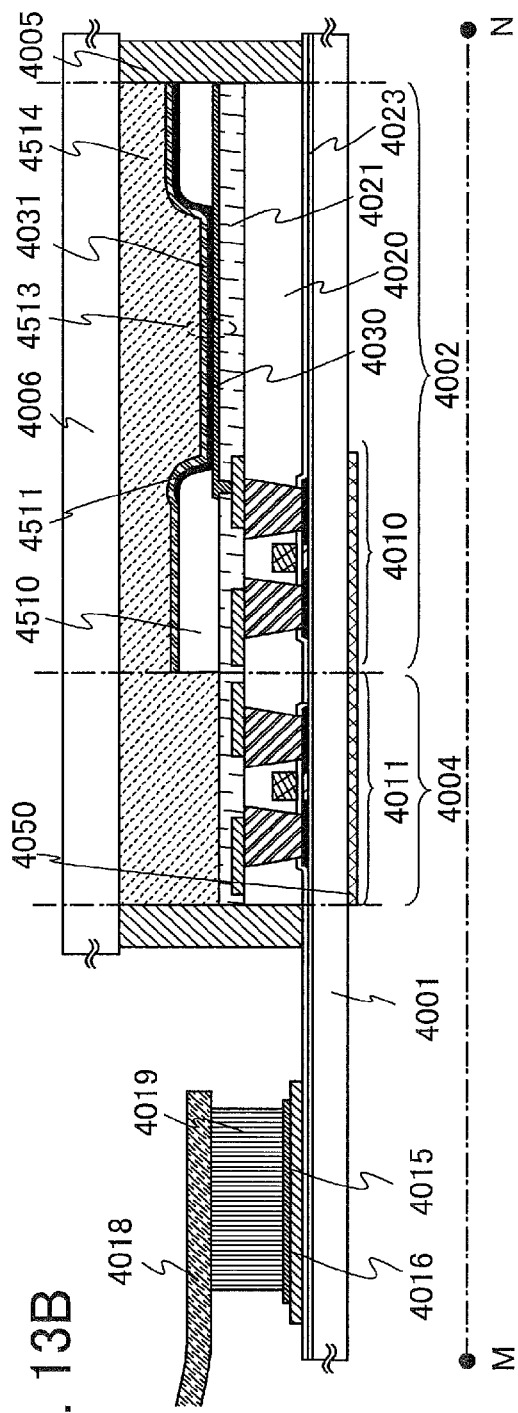
FIG. 13A
FIG. 13B

METHOD FOR MANUFACTURING SEMICONDUCTOR DEVICE AND SEMICONDUCTOR DEVICE

BACKGROUND OF THE INVENTION

1. Field of the Invention

The disclosed invention relates to a semiconductor device and a method for manufacturing the semiconductor device.

In this specification, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films formed over a substrate having an insulating surface has been attracting attention. The transistor is applied to a wide range of semiconductor devices such as integrated circuits (IC) and image display devices (also simply referred to as display devices). A silicon-based semiconductor material is widely known as a material for a semiconductor thin film applicable to a transistor. As another material, an oxide semiconductor has been attracting attention.

For example, Patent Document 1 and Patent Document 2 disclose a technique by which a transistor is manufactured using zinc oxide or an In—Ga—Zn—O-based oxide as an oxide semiconductor and is used as a switching element of a pixel or the like of a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

In order to achieve high-speed operation, low power consumption, high integration, or the like of a transistor, it is necessary to miniaturize a transistor.

An object of one embodiment of the present invention is to provide a structure of a semiconductor device which achieves high-speed response and high-speed operation by improving on characteristics of a miniaturized transistor (e.g., on-state current or field-effect mobility), and to provide a manufacturing method thereof, in order to achieve a high-performance semiconductor device.

Further, it is concerned that yield of transistors in the manufacturing process is decreased due to miniaturization thereof.

An object of the present invention is to provide a transistor having high electrical characteristics with a high yield even in the case of a minute structure.

In addition, another object of the present invention is to achieve high performance, high reliability, and high productivity also in a semiconductor device including the transistor.

In an embodiment of the disclosed invention, a source electrode layer and a drain electrode layer which are electrically connected to an oxide semiconductor layer are each provided to be embedded in an opening provided in a gate insulating layer over the oxide semiconductor layer and an insulating layer over a gate electrode layer, and an opening for providing the source electrode layer and an opening for providing the drain electrode layer are formed separately by different etching treatments using different masks. Thus, a distance between the gate electrode layer and a region where the source electrode layer (or the drain electrode layer) and the oxide semiconductor layer are in contact with each other can be reduced sufficiently. Further, the source electrode layer and the drain electrode layer are formed by forming a conductive film over an insulating layer and in an opening formed in the insulating layer, and removing the conductive film over the insulating layer by polishing (cutting or grinding). For the polishing (cutting or grinding) treatment, chemical mechanical polishing (CMP) treatment can be preferably used. More specifically, for example, the following manufacturing method can be employed.

An embodiment of the present invention is a manufacturing method for a semiconductor device including the steps of forming an oxide semiconductor layer over an insulating surface, forming a gate insulating layer over the oxide semiconductor layer, forming a gate electrode layer over the oxide semiconductor layer with the gate insulating layer provided therebetween, forming an insulating layer over the gate electrode layer, forming a first opening reaching the oxide semiconductor layer by etching the insulating layer and the gate insulating layer by use of a first mask, forming a second opening reaching the oxide semiconductor layer in a region opposite to the first opening with the gate electrode layer provided between the first opening and the second opening by etching the insulating layer and the gate insulating layer by use of a second mask, forming a conductive film over the insulating layer in a manner such that the conductive film is embedded in the first opening and the second opening, forming a source electrode layer or a drain electrode layer in the first opening or the second opening in a manner such that the conductive film provided over the insulating layer is removed by performing polishing treatment on the conductive film, and forming a source wiring layer or a drain wiring layer over the source electrode layer or the drain electrode layer.

In the above-described manufacturing method for a semiconductor device, it is preferable that an impurity be introduced to the oxide semiconductor layer using the gate electrode layer as a mask before the formation of the insulating layer, so that a first low-resistance region, a second low-resistance region, and a channel formation region sandwiched between the first low-resistance region and the second low-resistance region be formed in the oxide semiconductor layer in a self-aligned manner.

Further, another embodiment of the present invention is a semiconductor device including an oxide semiconductor layer, a gate insulating layer provided over the oxide semiconductor layer, a gate electrode layer provided over the oxide semiconductor layer with the gate insulating layer provided therebetween, an insulating layer provided over the gate electrode layer, a source electrode layer or a drain electrode layer embedded in the first opening or the second opening in the gate insulating layer and the insulating layer and electrically connected to the oxide semiconductor layer, and a source wiring layer and a drain wiring layer provided on and in contact with the source electrode layer and the drain electrode layer, respectively, in which a distance in a channel length direction (flowing direction of carriers) between the source electrode layer and the drain electrode layer is shorter than a distance in a channel length direction between the source wiring layer and the drain wiring layer.

In the above-described semiconductor device, the surface of the source electrode layer or the drain electrode layer is preferably planarized by chemical mechanical polishing treatment.

Moreover, in the above-described semiconductor device, the oxide semiconductor layer preferably includes a first low-resistance region, a second low-resistance region, and a channel formation region sandwiched between the first low-resistance region and the second low-resistance region.

The oxide semiconductor is in a single crystal state, a polycrystalline (also referred to as polycrystal) state, an amorphous state, or the like.

An amorphous oxide semiconductor can have a flat surface with relative ease; therefore, when a transistor with the use of the oxide semiconductor is operated, interface scattering can be reduced, and relatively high field-effect mobility can be obtained with relative ease.

In an oxide semiconductor having crystallinity, defects in the bulk can be further reduced, and when the surface flatness of the oxide semiconductor is improved, a transistor using the oxide semiconductor having crystallinity can obtain the field-effect mobility higher than that of the transistor using the oxide semiconductor in an amorphous state. In order to improve the surface evenness, the oxide semiconductor is preferably formed over a flat surface. Specifically, the oxide semiconductor may be formed over a surface with an average surface roughness (Ra) less than or equal to 0.15 nm, preferably less than or equal to 0.1 nm.

Note that, Ra is obtained by three-dimension expansion of arithmetic average roughness that is defined by JIS B 0601:2001 (ISO4287:1997) so as to be applied to a curved plane. The Ra can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function." There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the word concerning the thickness "substantially equal" means "almost equal" as well as "completely equal." For example, "substantially equal" refers to a case where, as compared to the "completely equal" thickness situation, there is a difference in thickness that causes a negligible influence on semiconductor device characteristics (a case where the influence on characteristics is 5% or less), a case where the thickness is slightly reduced by polishing without intention (a case where the polishing amount is approximately less than 5 nm), and the like.

According to an embodiment of the disclosed invention, miniaturization of transistors can be achieved. Further, according to another embodiment of the disclosed invention, a miniaturized transistor can be manufactured with a high yield.

Furthermore, according to another embodiment of the disclosed invention, the size of a transistor can be sufficiently reduced with favorable electrical characteristics maintained.

By sufficiently downsizing the transistor, an area of a semiconductor device including the transistor is decreased, and the number of semiconductor devices manufactured with one substrate is increased. Therefore, the manufacturing cost per semiconductor device is decreased. Further, since the semiconductor device is downsized, the semiconductor device which is substantially the same in size with further increased function can be realized. Furthermore, effects of high-speed operation, low power consumption, and the like of a transistor can be obtained in accordance with a reduction in channel length. In other words, according to one embodiment of the disclosed invention, miniaturization of a transistor including an oxide semiconductor is achieved, and therefore a variety of advantageous effects accompanied by the miniaturization can be obtained.

BRIEF DESCRIPTION OF THE DRAWINGS

In the accompanying drawings:

FIGS. 13A and 13B each illustrate an embodiment of a semiconductor device;

DETAILED DESCRIPTION OF THE INVENTION

Figure 1A:
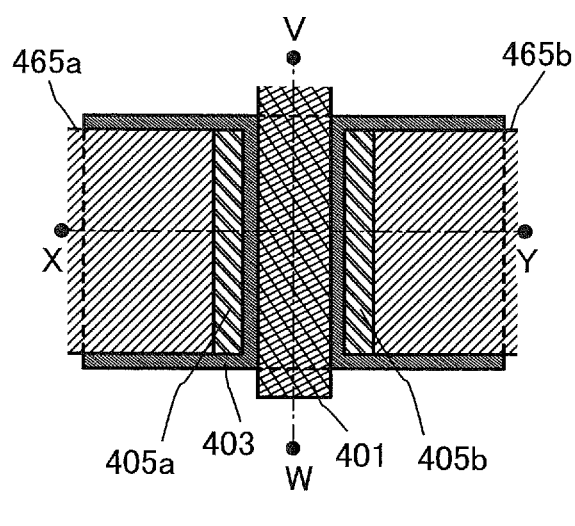
FIGS. 1A to 1C are a plan view and cross-sectional views illustrating an embodiment of a semiconductor device.

Hereinafter, embodiments of the invention disclosed in this specification will be described with reference to the accompanying drawings. However, the present invention is not limited to the description below and it is easily understood by those skilled in the art that the mode and details can be changed variously. Therefore, the present invention should not be construed as being limited to the content of the embodiments below. Note that in structures of the present invention described below, like portions or portions having similar functions are denoted by the same reference numerals in different drawings, and description thereof is not repeated. Further, the same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. In addition, the ordinal numbers in this specification do not denote particular names which specify the present invention.

Embodiment 1

In this embodiment, one embodiment of a semiconductor device and a method of manufacturing the semiconductor device will be described with reference to FIGS. 1A to 1C, FIGS. 2A to 2E, FIGS. 3A to 3C, and FIGS. 4A and 4B.

<Example of Structure of Semiconductor Device>

Figure 1C:
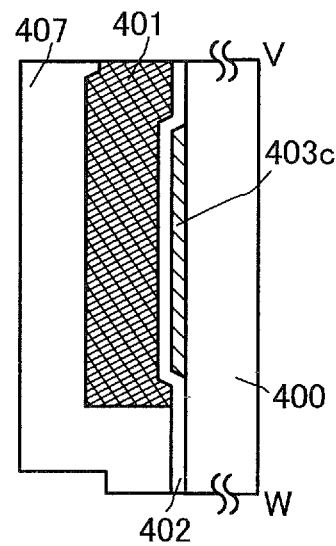
Figure 1B:
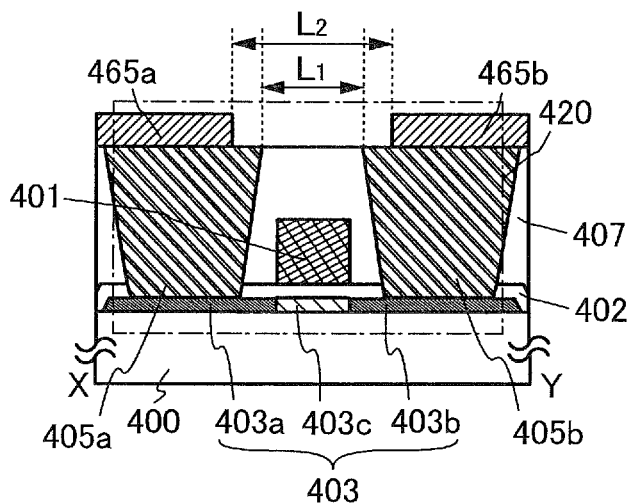

As examples of a semiconductor device, a plan view and cross-sectional views of a transistor 420 are illustrated in FIGS. 1A to 1C. FIG. 1A is a plan view of the transistor 420, FIG. 1B is a cross-sectional view taken along line X-Y in FIG. 1A, and FIG. 1C is a cross-sectional view taken along line V-W in FIG. 1A. Note that in FIG. 1A, some components of the transistor 420 (e.g., an insulating layer 407) are not illustrated for simplicity.

The transistor 420 in FIGS. 1A to 1C includes, over a substrate 400 having an insulating surface, an oxide semiconductor layer 403, a gate insulating layer 402 provided over the oxide semiconductor layer 403, a gate electrode layer 401 provided over the oxide semiconductor layer 403 with the gate insulating layer 402 provided therebetween, an insulating layer 407 provided over the gate electrode layer 401, a source electrode layer 405a and a drain electrode layer 405b electrically connected to the oxide semiconductor layer 403 each through an opening provided in the gate insulating layer 402 and the insulating layer 407, and a source wiring layer 465a and a drain wiring layer 465b provided on and in contact with, respectively, the source electrode layer 405a and the drain electrode layer 405b.

In the transistor 420, the source electrode layer 405a and the drain electrode layer 405b are each formed to be embedded in an opening formed in the gate insulating layer 402 and the insulating layer 407 and are each in contact with the oxide semiconductor layer 403. These electrode layers are formed as follows: a conductive film is formed over the insulating layer 407 to be embedded in an opening which is formed in the gate insulating layer 402 and the insulating layer 407 and reaches the oxide semiconductor layer 403; polishing treatment is performed on the conductive film; the conductive film over the insulating film 407 (a region which is overlapped with at least the gate electrode layer 401) is removed; and the conductive film is divided.

Further, in a cross-sectional view in a channel length direction, a distance in the channel length direction between the source electrode layer 405a and the drain electrode layer 405b ($L_1$ in FIG. 1B) is shorter than a distance in the channel length direction between the source wiring layer 465a and the drain wiring layer 465b ($L_2$ in FIG. 1B).

In this embodiment, the oxide semiconductor layer 403 is preferably a c-axis aligned crystalline oxide semiconductor (CAAC-OS) film.

The CAAC-OS film is not completely single crystal nor completely amorphous. The CAAC-OS film is an oxide semiconductor layer with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where an oxide semiconductor film is formed on one surface and crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of a transistor including the CAAC-OS film, change in electric characteristics of the transistor due to irradiation with visible light or ultraviolet light can be reduced. Thus, the transistor has high reliability.

Moreover, in the transistor 420, the oxide semiconductor layer 403 preferably includes a channel formation region 403c with which the gate electrode layer 401 is overlapped, and low-resistance regions 403a and 403b between which the channel formation region 403c is sandwiched and in which the resistance is lower than that of the channel formation region 403c and dopant is included. The low-resistance regions 403a and 403b can be formed in a self-aligned manner after the formation of the gate electrode layer 401 by introducing an impurity element using the gate electrode layer 401 as a mask. Further, the region can function as a source region or a drain region of the transistor 420. By providing the low-resistance regions 403a and 403b, electric field applied to the channel formation region 403c provided between the pair of low-resistance regions can be reduced. Further, the source electrode layer 405a and the drain electrode layer 405b are each in contact with a low-resistance region, whereby a contact resistance between the oxide semiconductor layer 403 and the source electrode layer 405a and the oxide semiconductor layer 403 and the drain electrode layer 405b can be reduced.

<Method for Manufacturing Semiconductor Device>

Examples of a manufacturing process of the transistor 420 in FIGS. 1A to 1C will be described below with reference to FIGS. 2A to 2E and FIGS. 3A to 3C.

First, the oxide semiconductor layer 403 is formed over the substrate 400 having an insulating surface.

There is no particular limitation on a substrate that can be used as the substrate 400 having an insulating surface as long as it has at least heat resistance sufficient to withstand heat treatment process performed later. For example, a glass substrate of barium borosilicate glass, aluminoborosilicate glass, or the like, a ceramic substrate, a quartz substrate, or a sapphire substrate can be used. Alternatively, the substrate 400 may be a single crystal semiconductor substrate or a polycrystalline semiconductor substrate of silicon, silicon carbide, or the like; a compound semiconductor substrate of silicon germanium or the like; an SOI substrate; or any of these substrates over which a semiconductor element is provided.

A semiconductor device may be fabricated using a flexible substrate as the substrate 400. To manufacture a flexible semiconductor device, the transistor 420 including the oxide semiconductor layer 403 may be directly formed over a flexible substrate; or alternatively, the transistor 420 including the oxide semiconductor layer 403 may be formed over a substrate, and then may be separated and transferred to a flexible substrate. Note that in order to separate the transistor from the formation substrate and transfer it to the flexible substrate, a separation layer is preferably provided between the formation substrate and the transistor 420 including an oxide semiconductor layer.

Note that a base insulating layer may be formed over the substrate 400. The base insulating layer can have a single-layer structure or a stacked structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer preferably has a single-layer structure or a stacked structure including an oxide insulating film so that the oxide insulating film is in contact with an oxide semiconductor layer to be formed later.

The base insulating layer preferably includes a region containing oxygen the proportion of which is higher than the stoichiometric proportion (hereinafter, also referred to as oxygen-excess region), in which case oxygen vacancies in the oxide semiconductor layer to be formed later can be filled with the excess oxygen contained in the base insulating layer. In the case of having a stacked structure, the base insulating layer preferably includes an oxygen-excess region at least in a layer in contact with the oxide semiconductor layer. In order to provide the oxygen-excess region in the base insulating layer, for example, the base insulating layer may be formed in an oxygen atmosphere. Alternatively, the oxygen-excess region may be formed by implanting oxygen (including at least one of an oxygen radical, an oxygen atom, and an oxygen ion) into the base insulating layer after its formation. Oxygen can be implanted by an ion implantation method, an ion doping method, a plasma immersion ion implantation method, plasma treatment, or the like.

The oxide semiconductor layer 403 may have either a single-layer structure or a stacked-layer structure. Further, the oxide semiconductor film may either have an amorphous structure or be a crystalline oxide semiconductor. In the case where the oxide semiconductor layer 403 has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor layer 403 can be formed by a sputtering method, a molecular beam epitaxy (MBE) method, a CVD method, a pulse laser deposition method, an atomic layer deposition (ALD) method, or the like as appropriate. Alternatively, the oxide semiconductor layer 403 may be formed with a sputtering apparatus where film formation is performed with surfaces of a plurality of substrates set substantially perpendicular to a surface of a sputtering target.

In the formation of the oxide semiconductor layer 403, the hydrogen concentration in the oxide semiconductor layer 403 is preferably reduced as much as possible. In order to reduce the hydrogen concentration, for example, in the case where the oxide semiconductor film is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a process chamber of a sputtering apparatus.

The oxide semiconductor layer is formed in such a manner that a sputtering gas from which hydrogen and moisture have been removed is introduced into the deposition chamber while moisture remaining therein is removed, whereby the hydrogen concentration in the formed oxide semiconductor layer can be reduced. In order to remove moisture remaining in the deposition chamber, an entrapment vacuum pump such as a cryopump, an ion pump, or a titanium sublimation pump is preferably used. A turbo molecular pump provided with a cold trap may be used. In the deposition chamber which is evacuated with the cryopump, a hydrogen molecular, a compound containing a hydrogen atom such as water ($H_2O$) (more preferably, also a compound containing a carbon atom), and the like are removed, whereby the impurity concentration in the oxide semiconductor layer 403 formed in the deposition chamber can be reduced.

Further, in the case where the oxide semiconductor layer 403 is formed by a sputtering method, the relative density (the fill rate) of the metal oxide target which is used for forming the oxide semiconductor layer 403 is 90% to 100% inclusive, preferably 95% to 99.9% inclusive. With the use of a metal oxide target with a high relative density, a dense oxide semiconductor layer can be deposited.

Note that in the case where a CAAC-OS film is formed as the oxide semiconductor layer 403, for example, the CAAC-OS film can be formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In order to reduce the impurity concentration in the oxide semiconductor layer 403, it is also effective to form the oxide semiconductor layer 403 while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor layer can be formed.

An oxide semiconductor used for the oxide semiconductor layer 403 preferably contains at least indium (In) or zinc (Zn). In particular, In and Zn are preferably contained. As a stabilizer for reducing a variation in electrical characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that it is preferable that the oxide semiconductor layer 403 be formed under a condition that much oxygen is contained during film formation (e.g., formed by a sputtering method in a 100% oxygen atmosphere), so as to be a film containing much oxygen (preferably having a region containing oxygen in excess of the stoichiometric ratio in the oxide semiconductor in a crystalline state).

It is preferable that a high-purity gas from which impurities such as hydrogen, water, a hydroxyl group, and hydride have been removed be used as a sputtering gas used for the formation of the oxide semiconductor layer 403.

There are three methods for obtaining a CAAC-OS film when the CAAC-OS film is used as the oxide semiconductor layer 403. The first method is to form an oxide semiconductor layer at a film formation temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Before the formation of the oxide semiconductor layer 403, planarization treatment may be performed on the surface on which the oxide semiconductor layer 403 is to be formed. As the planarization treatment, polishing treatment (e.g., chemical mechanical polishing (CMP)), dry-etching treatment, or plasma treatment can be used, though there is no particular limitation on the planarization treatment.

As a plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface on which the oxide semiconductor layer 403 is to be formed.

As the planarization treatment, a polishing treatment, a dry etching treatment, or a plasma treatment may be performed plural times, or these treatments may be performed in combination. In the case where the treatments are combined, the order of steps may be set as appropriate, without particular limitation, depending on the unevenness of the surface on which the oxide semiconductor layer 403 is to be formed.

The formed oxide semiconductor layer is processed into an island-shaped oxide semiconductor layer 403 by a photolithography process. A resist mask for processing the oxide semiconductor layer into the island-shaped oxide semiconductor layer 403 may be formed by an inkjet method. Formation of the resist mask by ink jetting needs no photomask; thus, manufacturing cost can be reduced.

Further, the oxide semiconductor layer 403 is preferably subjected to heat treatment for removing excess hydrogen (including water and a hydroxyl group) in the oxide semiconductor layer 403 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 102 after the dehydration or dehydrogenation treatment can be $5 \times 10^{19}/cm^3$ or lower, preferably $5 \times 10^{18}/cm^3$ or lower.

Note that the heat treatment for dehydration or dehydrogenation may be performed at any timing in the process of manufacturing the transistor 420 as long as the heat treatment is performed after the formation of the oxide semiconductor layer. In the case where an aluminum oxide film is used as the gate insulating layer 402 or the insulating layer 407, the heat treatment is preferably performed before the formation of the aluminum oxide film. Further, the heat treatment for the dehydration or dehydrogenation may be performed plural times, and may double as another heat treatment.

Note that in the case where a base insulating layer including oxygen is provided over the substrate 400, the heat treatment for the dehydration or dehydrogenation is preferably performed before the oxide semiconductor layer 403 is processed into an island shape because oxygen contained in the base insulating layer can be prevented from being released by the heat treatment.

Note that in the heat treatment, it is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor layer 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the $N_2O$ gas. The purity of the oxygen gas or the $N_2O$ gas which is introduced into the heat treatment apparatus is preferably 6N or higher, more preferably 7N or higher (i.e., the impurity concentration in the oxygen gas or the $N_2O$ gas is preferably 1 ppm or lower, more preferably 0.1 ppm or lower). The oxygen gas or the $N_2O$ gas acts to supply oxygen that is a main component of the oxide semiconductor and that has been reduced by removing an impurity for the dehydration or dehydrogenation, so that the oxide semiconductor layer 403 can have high purity and be an i-type (intrinsic) oxide semiconductor layer.

Further or alternatively, oxygen (which includes at least one of an oxygen radical, an oxygen atom, and an oxygen ion) may be introduced into the oxide semiconductor layer that has been subjected to the dehydration or dehydrogenation treatment in order to supply oxygen to the oxide semiconductor layer.

Introduction (supply) of oxygen to the dehydrated or dehydrogenated oxide semiconductor layer 403 enables the oxide semiconductor layer 403 to be highly purified and to be i-type (intrinsic). Variation in electrical characteristics of a transistor having the highly-purified and i-type (intrinsic) oxide semiconductor layer 403 is suppressed, and the transistor is electrically stable.

In the step of introducing oxygen into the oxide semiconductor layer 403, oxygen may be directly introduced into the oxide semiconductor layer 403 or introduced into the oxide semiconductor layer 403 through another film such as the gate insulating layer 402 or the insulating layer 407 formed later. An ion implantation method, an ion doping method, a plasma immersion ion implantation method, or the like may be employed for the introduction of oxygen through another film, whereas plasma treatment or the like can be employed in addition to the above methods for the introduction of oxygen directly into the exposed oxide semiconductor layer 403.

The addition of oxygen into the oxide semiconductor layer 403 can be performed anytime after dehydration or dehydrogenation treatment is performed thereon. Further, oxygen may be introduced a plurality of times into the dehydrated or dehydrogenated oxide semiconductor layer 403.

Figure 2A:
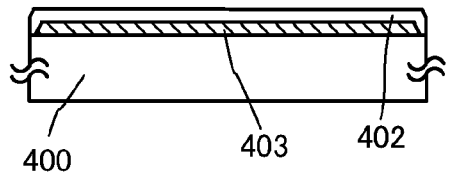
FIGS. 2A to 2E are cross-sectional views illustrating an example of a manufacturing process of a semiconductor device.

Next, a gate insulating layer 402 covering the oxide semiconductor layer 403 is formed (see FIG. 2A).

The gate insulating layer 402 can be formed to have a thickness greater than or equal to 1 nm and less than or equal to 20 nm by a sputtering method, an MBE method, a CVD method, a pulse laser deposition method, an ALD method, or the like as appropriate. Alternatively, the gate insulating layer 402 may be formed with a sputtering apparatus where deposition is performed with surfaces of a plurality of substrates set substantially perpendicular to a surface of a sputtering target.

The gate insulating layer 402 can use a silicon oxide, a gallium oxide, an aluminum oxide, a silicon nitride, a silicon oxynitride, an aluminum oxynitride, a silicon nitride oxide, or the like. It is preferable that the gate insulating layer 402 include oxygen in a portion which is in contact with the oxide semiconductor layer 403. In particular, the gate insulating layer 402 preferably contains, in the film (bulk), oxygen whose content is in excess of the oxygen content in the stoichiometric composition ratio. For example, in the case where a silicon oxide film is used as the gate insulating layer 402, the composition formula is preferably $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor layer 403, leading to favorable characteristics. Further, the gate insulating layer 402 is preferably formed in consideration of the size of a transistor to be formed and the step coverage with the gate insulating layer 402.

The gate insulating layer 402 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Further, the gate insulating layer 402 may have either a single-layer structure or a layered structure.

Next, the gate electrode layer 401 is formed over the island-shaped oxide semiconductor layer 403 with the gate insulating layer 402 provided therebetween. The gate electrode layer 401 can be formed by a plasma-enhanced CVD method, a sputtering method, or the like. Further, as a material of the gate electrode layer 401, a metal film containing an element selected from molybdenum, titanium, tantalum, tungsten, aluminum, copper, chromium, neodymium, or scandium; a metal nitride film containing any of the above elements as its component (e.g., a titanium nitride film, a molybdenum nitride film, or a tungsten nitride film); or the like can be used. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a layered structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a layered structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volt), preferably higher than or equal to 5.5 eV (electron volt), and the use of this film as the gate electrode layer enables the threshold voltage of electric characteristics of a transistor to be positive. Accordingly, a so-called normally-off switching element can be obtained.

Note that the gate electrode layer 401 can be formed by processing a conductive film (not illustrated) provided over the gate insulating layer 402 with use of a mask. Here, as the mask used for processing, a mask having a finer pattern which is formed by performing a slimming process on a mask formed by a photolithography method or the like is preferably used.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Note that the channel length (L) of a transistor is determined by the mask formed by the slimming process. Therefore, it can be preferable to employ a process with high controllability as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can become greater than or equal to 30 nm and less than or equal to 2000 nm, preferably greater than or equal to 50 nm and less than or equal to 350 nm. This enables further miniaturization of the transistor.

Figure 2B:
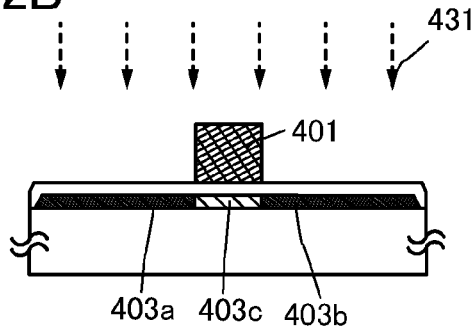

Next, a dopant 431 may be introduced into the oxide semiconductor layer 403 with the use of the gate electrode layer 401 as a mask, so that low-resistance regions 403*a* and 403*b* and a channel formation region 403*c* are formed in a self-aligned manner (see FIG. 2B).

The dopant 431 is an impurity by which the electrical conductivity of the oxide semiconductor layer 403 is changed. One or more selected from the following can be used as the dopant 431: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 431 can be introduced into the oxide semiconductor layer 403 through other films (e.g., the insulating layer 407) by an implantation method. As the method for introducing the dopant 431, an ion implantation method, an ion doping method, a plasma immersion ion implantation method, or the like can be used. In that case, it is preferable to use a single ion of the dopant 431 or a fluoride ion or a chloride ion thereof.

The addition of the dopant 431 can be controlled as appropriate by setting the addition conditions such as the accelerated voltage and the dosage, or the thickness of the film through which the dopant 431 passes. In this embodiment, boron is used as the dopant 431, whose ion is added by an ion implantation method. The dosage of the dopant 431 can be set to be greater than or equal to $1 \times 10^{13}$ ions/cm$^2$ and less than or equal to $5 \times 10^{16}$ ions/cm$^2$.

The concentration of the dopant 431 in the low-resistance regions 403a and 403b is preferably greater than or equal to $5 \times 10^{18}$/cm$^3$ and less than or equal to $1 \times 10^{22}$/cm$^3$.

The dopant 431 may be added while the substrate 400 is heated.

The addition of the dopant 431 to the oxide semiconductor layer 403 may be performed plural times, and the number of kinds of dopant may be plural.

Further, heat treatment may be performed after the addition of the dopant 431. The heat treatment is preferably performed at a temperature higher than or equal to 300° C. and lower than or equal to 700° C., more preferably higher than or equal to 300° C. and lower than or equal to 450° C., under an oxygen atmosphere for 1 hour. The heat treatment may be performed under a nitrogen atmosphere, reduced pressure, or the air (ultra-dry air).

In the case where the oxide semiconductor layer 403 is a crystalline oxide semiconductor layer, part of the crystalline oxide semiconductor layer becomes amorphous in some cases by addition of the dopant 431. In that case, the crystallinity of the oxide semiconductor layer 403 can be recovered by performing heat treatment after the addition of the dopant 431.

Figure 2C:
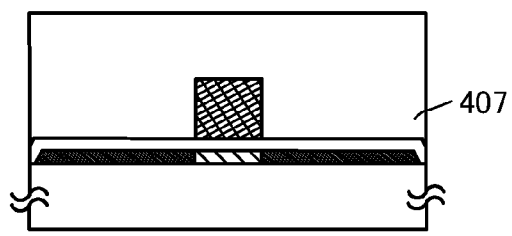

Next, the insulating layer 407 is formed over the gate insulating layer 402 and the gate electrode layer 401 (see FIG. 2C).

The insulating layer 407 can be formed by a plasma-enhanced CVD method, a sputtering method, an evaporation method, or the like. As the insulating layer 407, an inorganic insulating film such as a silicon oxide film, a silicon oxynitride film, an aluminum oxynitride film, or a gallium oxide film, or the like can be typically used.

As the insulating layer 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating layer 407 may have a single-layer structure or a stacked-layer structure, and for example a stack of a silicon oxide film and an aluminum oxide film can be used. The aluminum oxide film can be preferably applied because of a high shielding effect (blocking effect) which enables impermeability of both oxygen and impurities such as hydrogen and moisture; and in and after the manufacturing process, the aluminum oxide film functions as a protective film for preventing entry of an impurity such as hydrogen or moisture, which causes a change in characteristics, into the oxide semiconductor layer 403 and release of oxygen, which is a main constituent material of the oxide semiconductor, from the oxide semiconductor layer 403.

The insulating layer 407 is preferably formed by a method such as a sputtering method, in which an impurity such as water or hydrogen does not enter the insulating layer 407.

In order to remove residual moisture from the deposition chamber of the insulating layer 407 in a manner similar to that of the formation of the oxide semiconductor layer 403, an entrapment vacuum pump (such as a cryopump) is preferably used. When the insulating layer 407 is deposited in the deposition chamber evacuated using a cryopump, the impurity concentration of the insulating layer 407 can be reduced. As an evacuation unit for removing moisture remaining in the deposition chamber of the insulating layer 407, a turbo molecular pump provided with a cold trap may be used.

In this embodiment, as the insulating layer 407, a stacked-layer structure in which an aluminum oxide film and a silicon oxide film are stacked in this order on the side which is in contact with the gate electrode layer 401 is employed. Note that the aluminum oxide film has a high density (film density higher than or equal to 3.2 g/cm$^3$, preferably higher than or equal to 3.6 g/cm$^3$), whereby the transistor 420 can have stable electrical characteristics. The film density can be measured by Rutherford backscattering spectrometry (RBS) or X-ray reflection (XRR).

Figure 2D:
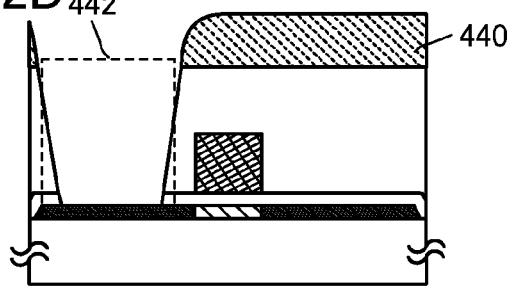
Figure 2E:
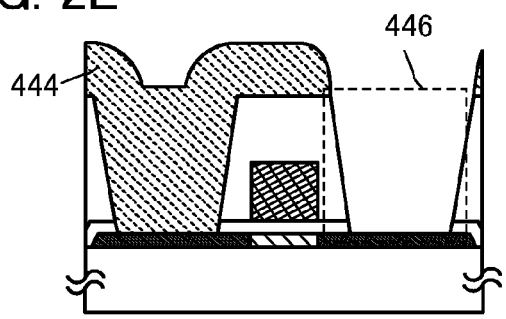

Next, a mask 440 is formed over the insulating layer 407, and the insulating layer 407 and the gate insulating layer 402 are etched with the use of the mask 440, so that an opening 442 which reaches the oxide semiconductor layer 403 (specifically, the low-resistance region 403a) is formed (see FIG. 2D).

The mask 440 can be formed by a photolithography method using a material such as a photoresist. For light exposure at the time of forming the mask 440, extreme ultraviolet light having a wavelength as short as several nanometers to several tens of nanometers is preferably used. In the light exposure by extreme ultraviolet light, the resolution is high and the focus depth is large. Thus, the mask 440 having a fine pattern can be formed.

As long as it is possible to form the mask 440 having a sufficiently fine pattern, a different method such as an ink jet method may be used to form the mask 440. In this case, it is unnecessary to use a photosensitive material such as a photoresist as a material of the mask 440.

After the mask 440 is removed, a mask 444 is formed in the opening 442 and over the insulating layer 407. The mask 444 can be formed in a manner similar to that of the mask 440. The insulating layer 407 and the gate insulating layer 402 are etched with the use of the mask 444, so that an opening 446 which reaches the oxide semiconductor layer 403 (specifically, the low-resistance region 403b) is formed (see FIG. 2E). Thus, a pair of openings sandwiching the gate electrode layer 401 therebetween is formed in the gate insulating layer 402 and the insulating layer 407. After the opening 446 is formed, the mask 444 is removed.

Figure 3A:
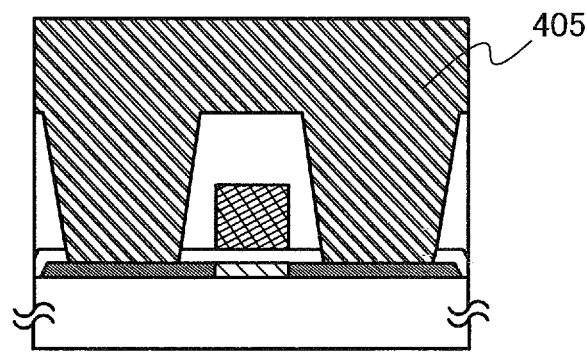
FIGS. 3A to 3C are cross-sectional views illustrating an example of a manufacturing process of a semiconductor device.

Next, a conductive film 405 to be a source electrode layer and a drain electrode layer is formed over the insulating layer 407 to be embedded in the opening 442 and the opening 446 (see FIG. 3A).

The conductive film 405 is formed of a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like, so as to sandwich the metal film. Further alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide mixed oxide ($In_2O_3$—$SnO_2$; abbreviated to ITO), indium oxide-zinc oxide mixed oxide ($In_2O_3$—ZnO), or any of these metal oxide materials in which silicon or silicon oxide is contained can be used.

Figure 3B:
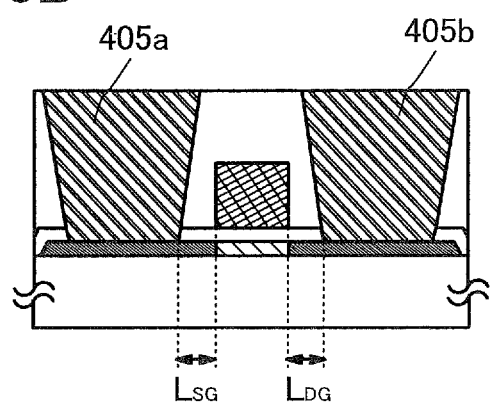

Next, CMP treatment is performed on the conductive film 405 (see FIG. 3B). The CMP treatment is performed on the conductive film 405 in order to remove the conductive film 405 provided over the insulating layer 407 (at least a region with which the gate electrode layer 401 is overlapped), whereby the source electrode layer 405a and the drain electrode layer 405b embedded in the opening 442 and the opening 446 can be formed. In this embodiment, through the CMP treatment performed on the conductive film 405 under such conditions that the surface of the insulating layer 407 can be exposed, the source electrode layer 405a and the drain electrode layer 405b are formed. Note that the surface of the insulating layer 407 or the surface of the gate electrode layer 401 may also be polished depending on conditions of the CMP treatment.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, it is preferable that first polishing be performed at a high polishing rate and final polishing be performed at a low polishing rate. By performing polishing at different polishing rates, the surfaces of the source electrode layer 405a, the drain electrode layer 405b, and the insulating layer 407 can be further improved.

Note that in this embodiment, the CMP treatment is used for removing the conductive film 405 in the region with which the insulating layer 407 is overlapped; however, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (reverse sputtering or the like) may be performed to improve the planarity of the surface to be processed. In the case where the polishing treatment is combined with etching treatment, plasma treatment or the like, the order of the steps is not particularly limited, and may be set as appropriate depending on the material, thickness, and roughness of the surface of the conductive film 405.

As described above, the source electrode layer 405a or the drain electrode layer 405b is provided to be embedded in the opening provided in the gate insulating layer 402 and the insulating layer 407. Therefore, in the transistor 420, a distance between the gate electrode layer 401 ($L_{SG}$ in FIG. 3B) and a region where the source electrode layer 405a is in contact with the oxide semiconductor layer 403 (a source side contact region) is determined by a distance between an end portion of the opening 442 and an end portion of the gate electrode layer 401. In the same manner, in the transistor 420, a distance between the gate electrode layer 401 ($L_{DG}$ in FIG. 3B) and a region where the drain electrode layer 405b is in contact with the oxide semiconductor layer 403 (a drain side contact region) is determined by a distance between an end portion of the opening 446 and an end portion of the gate electrode layer 401.

In the case where the opening 442 for providing the source electrode layer 405a and the opening 446 for providing the drain electrode layer 405b are formed by performing etching treatment once, the minimum feature size of a distance between the opening 442 and the opening 446 in the channel length direction is limited to a resolution limit of a light-exposure apparatus used for forming a mask. Therefore, it is difficult to reduce a distance between the opening 442 and the opening 446 sufficiently, so that it is also difficult to reduce distances between the source side contact region and the gate electrode layer 401 ($L_{SG}$), and between the drain side contact region and the gate electrode layer 401 ($L_{DG}$).

However, in the manufacturing method shown in this embodiment, the opening 442 and the opening 446 are formed separately by different etching treatments using different masks; therefore, the position of the openings can be set freely without depending on the resolution limit of a light-exposure apparatus. Thus, the distance between the source side contact region or the drain side contact region and the gate electrode layer 401 ($L_{SG}$ or $L_{DG}$) can be reduced to as low as or greater than 0.05 μm and less than or equal to 0.1 μm, for example. By reducing $L_{SG}$ and $L_{DG}$, the resistance between the source and the drain of the transistor 420 can be reduced, so that the electrical characteristics of the transistor (e.g., on-state current characteristics) can be improved.

Further, in the step of removing the conductive film 405 over the insulating layer 407 for forming the source electrode layer 405a and the drain electrode layer 405b, etching treatment using a resist mask is not performed, so that the conductive film can be processed minutely and precisely even in the case where the distance between the source electrode layer 405a and the drain electrode layer 405b in the channel length direction is reduced. Thus, in the manufacturing process of the semiconductor device, the transistor 420 having less variation in shapes and characteristics and a minute structure can be manufactured with a high yield.

Figure 3C:
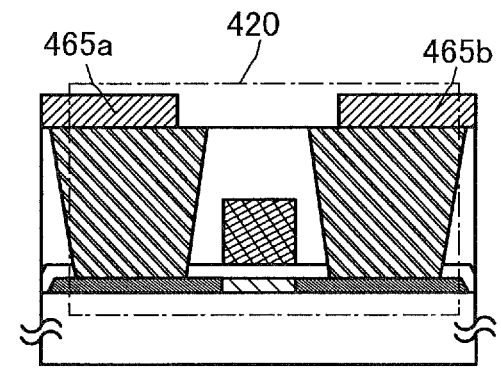

Next, a conductive film to be a source wiring layer or a drain wiring layer (including a wiring formed in the same layer as the wiring layers) is formed over the source electrode layer 405a, the drain electrode layer 405b, and the insulating layer 407 and is processed, so that the source wiring layer 465a and the drain wiring layer 465b are formed (see FIG. 3C).

The source wiring layer 465a and the drain wiring layer 465b can be formed using a material and a method similar to those of the gate electrode layer 401. For example, as the source wiring layer 465a and the drain wiring layer 465b, a stack of a tantalum nitride film and a copper film or a stack of a tantalum nitride film and a tungsten film can be used.

As described above, the distance between the source electrode layer 405a and the drain electrode layer 405b in the channel length direction can be processed minutely without depending on the resolution limit of a light-exposure apparatus. On the other hand, the source wiring layer 465a and the drain wiring layer 465b are processed using a mask formed by a photolithography method; therefore, the width (the distance therebetween in the channel length direction) becomes longer than that between the source electrode layer 405a and the drain electrode layer 405b. For miniaturizing the transistor 420, the distance between the source wiring layer 465a and the drain wiring layer 465b is preferably set in accordance with the resolution limit of a light-exposure apparatus.

Through the above process, the transistor 420 in this embodiment is formed.

A planarization insulating film may be formed over the transistor 420 in order to reduce surface roughness due to the transistor. As the planarization insulating film, an organic material such as a polyimide, an acrylic, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Note that in the transistor 420, the total thickness of the gate insulating layer 402 and the insulating layer 407 in the region sandwiched between the source electrode layer 405a and the drain electrode layer 405b (also referred to as a distance from the surface of the oxide semiconductor layer 403 to the top surface of the insulating layer 407) is substantially equal to the thickness of the source electrode layer 405a and the thickness of the drain electrode layer 405b; and the top surfaces of the source electrode layer 405a, the drain electrode layer 405b, and the insulating layer 407 are substantially all at a same vertical level. However, this embodiment is not limited thereto.

Figure 4A:
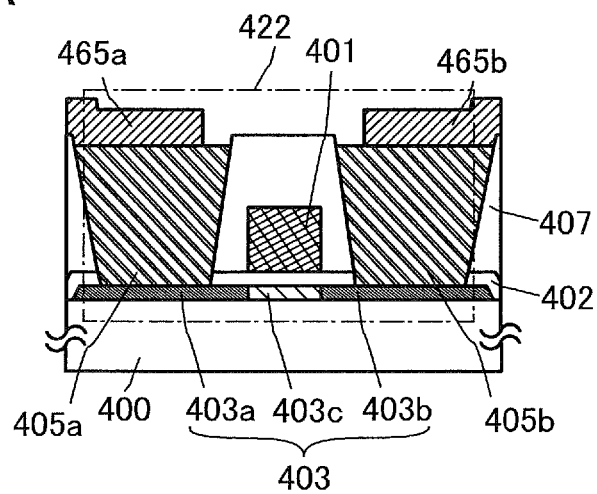
FIGS. 4A and 4B are each a cross-sectional view of an embodiment of a semiconductor device.
Figure 4B:
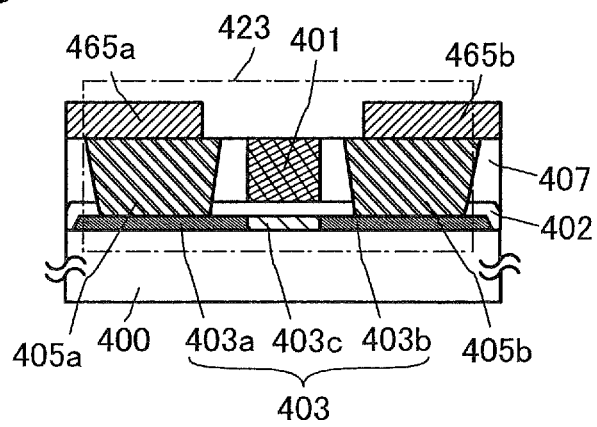

For example, as the transistor 422 illustrated in FIG. 4A, a height difference may be formed between the top surface of the source electrode layer 405a or the drain electrode layer 405b and the top surface of the insulating layer 407 depending on conditions of the polishing treatment of the conductive film 405. Further, as the transistor 423 illustrated in FIG. 4B, the top surface of the gate electrode layer 401 may be exposed by polishing treatment of the conductive film 405 and the insulating layer 407. Furthermore, the upper portion of the gate electrode layer 401 may be partly removed by polishing treatment. The structure like that of the transistor 423, in which the gate electrode layer 401 is exposed, can be used for an integrated circuit in which other wirings or semiconductor elements are stacked over the transistor 423.

As described above, in one embodiment of the disclosed invention, the opening 442 for providing the source electrode layer 405a and the opening 446 for providing the drain electrode layer 405b are formed separately by different etching treatments using different masks. Thus, the transistor 420 can be miniaturized sufficiently and distances between the source side contact region and the gate electrode layer 401, and between the drain side contact region and the gate electrode layer 401 can be reduced sufficiently, so that the resistance between the source and the drain of the transistor 420 can be reduced. Therefore, the electrical characteristics of the transistor (e.g., on-state current characteristics) can be improved.

Further, in the step of removing the conductive film 405 over the insulating layer 407 for forming the source electrode layer 405a and the drain electrode layer 405b, etching treatment using a resist mask is not performed, so that the conductive film can be processed minutely and precisely even in the case where the distance between the source electrode layer 405a and the drain electrode layer 405b is reduced. Thus, in the manufacturing process of the semiconductor device, the transistor 420 having less variation in shapes and characteristics and a minute structure can be manufactured with a high yield.

As described above, according to an embodiment of the disclosed invention, a semiconductor device which achieves miniaturization can be provided while the defects are suppressed and favorable characteristics are maintained.

The methods and structures described in this embodiment can be combined as appropriate with any of the methods and structures described in the other embodiments.

Embodiment 2

In this embodiment, an example of a semiconductor device which includes the transistor described in this specification, which can hold stored data even when not powered, and which does not have a limitation on the number of write cycles, will be described with reference to drawings.

Figure 5A:
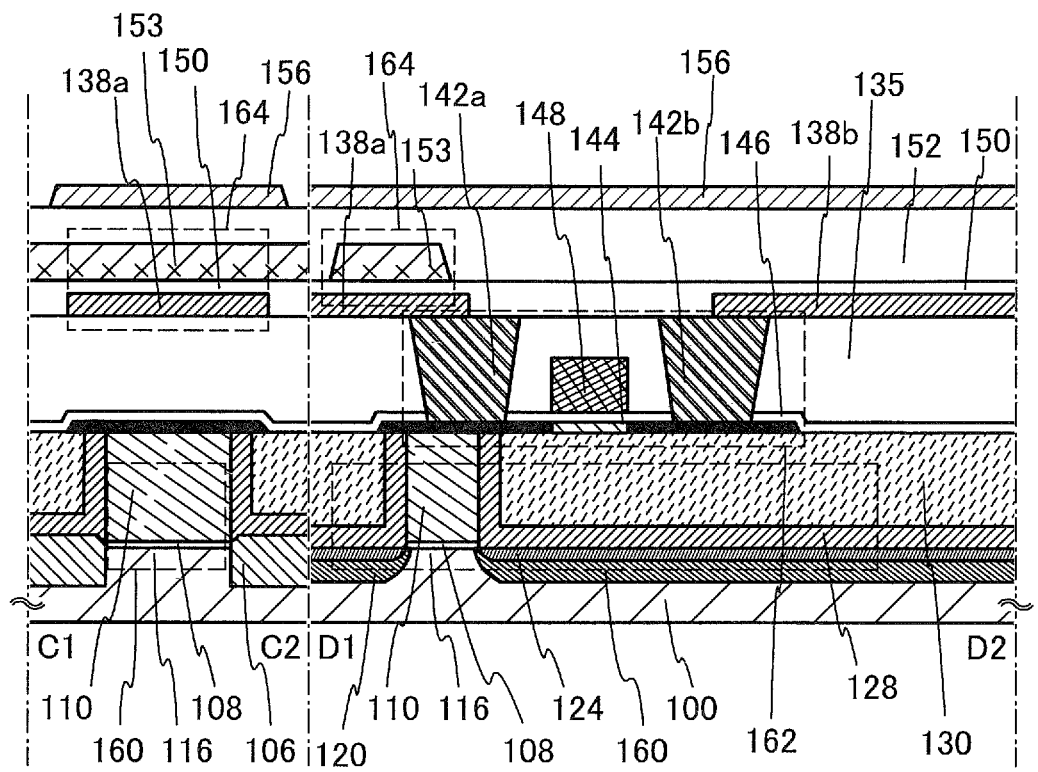
FIGS. 5A to 5C are a cross-sectional view, a plan view, and a circuit diagram illustrating an embodiment of a semiconductor device.
Figure 5B:
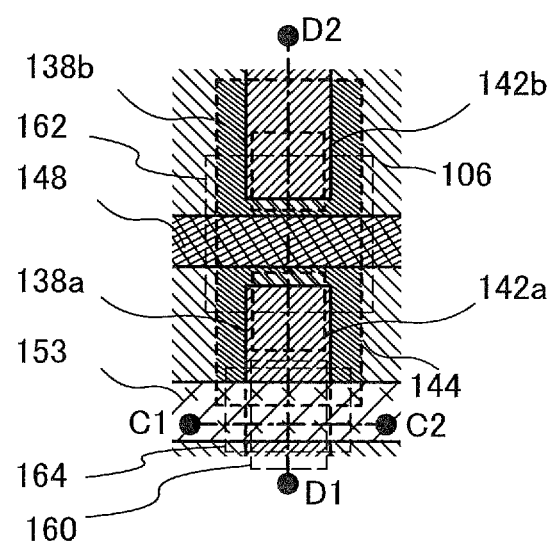
Figure 5C:
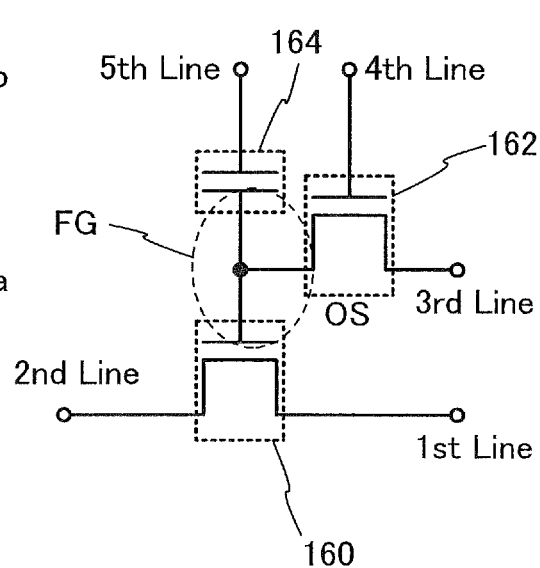

FIGS. 5A and 5B illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A and 5B includes a transistor 160 including a first semiconductor material in a lower portion, and the transistor 162 including a second semiconductor material in an upper portion. The transistor 162 applies the structure of the transistor 420 shown in Embodiment 1 as an example.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, p-channel transistors may be used. Further, the transistors are used as the transistor using an oxide semiconductor as shown in Embodiment 1 so that data can be held. Furthermore, it is not necessary to limit a specific structure of the semiconductor device, such as a material of the semiconductor device or a structure of the semiconductor device, to the structure described here.

The transistor 160 in FIG. 5A includes a channel formation region 116 provided over a substrate 100 including a semiconductor material (e.g., silicon), impurity regions 120 with the channel formation region 116 provided therebetween, metal compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating layer 106 is provided over the substrate 100 to surround the transistor 160. Insulating layers 128 and 130 are provided to cover the transistor 160. Note that in the transistor 160, the sidewall insulating layer may be formed on a side surface of the gate electrode 110 and the impurity regions 120 may include a region having a different impurity concentration.

The transistor 160 including a single crystal semiconductor substrate can operate at high speed. Thus, when the transistor is used as a reading transistor, data can be read at a high speed.

An insulating film is formed between the transistor 160 and the transistor 162. In FIG. 5A, the insulating layer 128 and the insulating layer 130 are formed over the transistor 160. Note that as treatment before the transistor 162 and a capacitor 164 are formed, CMP treatment is performed on the insulating layers over the transistor 160, whereby planarized insulating layers 128 and 130 are formed, and at the same time, an upper surface of the gate electrode 110 is exposed.

As the insulating layer 128, 130, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating layer 128, 130 can be formed by a plasma enhanced CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be applied to form the insulating layer 128, 130.

Note that in this embodiment, a silicon nitride film is used as the insulating layer 128 and a silicon oxide film is used as the insulating layer 130.

Planarization treatment is preferably performed on the surface of the insulating layer 130, on which an oxide semiconductor layer 144 is to be formed. In this embodiment, the oxide semiconductor layer 144 is formed over the insulating layer 130 which is planarized sufficiently (preferably, an average surface roughness of the insulating layer 130 is less than or equal to 0.15 nm) by polishing treatment (e.g., CMP treatment).

The transistor 162 shown in FIG. 5A includes an oxide semiconductor in the channel formation region. Here, an oxide semiconductor layer 144 included in the transistor 162 is preferably highly purified. By using a highly purified oxide semiconductor, the transistor 162 can have extremely favorable off-state current characteristics.

Since the off-state current of the transistor 162 is small, stored data can be held for a long time owing to such a transistor. In other words, power consumption can be sufficiently reduced because a semiconductor storage device in which refresh operation is unnecessary or the frequency of refresh operation is extremely low can be provided.

In a manufacturing process of the transistor 162, a step of removing a conductive film provided over the insulating layer 135 by chemical mechanical polishing treatment is used, whereby electrode layers 142*a* and 142*b* each functioning as a source electrode layer or a drain electrode layer are formed.

In addition, wiring layers 138*a* and 138*b* which are each connected to the electrode layers 142*a* or 142*b* and each function as a source wiring layer or a drain wiring layer.

A distance between the gate electrode 148 and the region where the electrode layer 142*a* and the electrode layer 142*b* each functioning as the source electrode layer or the drain electrode layer is in contact with the oxide semiconductor layer 144 (a contact region) can be reduced; therefore, the resistance between the gate electrode 148 and the region where the electrode layer 142*a* or the electrode layer 142*b* is in contact with the oxide semiconductor layer 144 (a contact region) can be reduced, so that on characteristics of the transistor 162 can be improved.

In the step of removing the conductive film over the gate electrode 148 in the formation process of the electrode layers 142*a* and 142*b*, an etching process using a resist mask is not performed, so that a minute process can be precisely performed. Thus, in the manufacturing process of the semiconductor device, the transistor having little variation in shapes and characteristics and a minute structure can be manufactured with a high yield.

An insulating film 150 having a single-layer structure or a stacked-layer structure is provided over the transistor 162. In this embodiment, an aluminum oxide film is used as the insulating film 150. The aluminum oxide film has a high density (film density higher than or equal to 3.2 g/cm$^3$, preferably higher than or equal to 3.6 g/cm$^3$), whereby the transistor 162 can have stable electrical characteristics.

Further, an inorganic insulating film (preferably the aluminum oxide film) functioning as a protective film may be provided to cover the oxide semiconductor layer 144, the gate insulating film 146, and the gate electrode 148.

In addition, a conductive layer 153 is provided in a region overlapping with the wiring layer 138*a* which is electrically connected to the electrode layer 142*a* of the transistor 162 with the insulating film 150 provided therebetween, and the wiring layer 138*a*, the insulating film 150, and the conductive layer 153 form a capacitor 164. That is, the wiring layer 138*a* of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162. Note that in FIG. 5A, one of the low-resistance regions in the oxide semiconductor layer 144 of the transistor 162 is provided to be in contact with the gate electrode 110 of the transistor 160, which is exposed from the insulating layer 130. Therefore, the gate electrode 110 of the transistor 160 is electrically connected to the wiring layer 138*a* which is one of the electrodes of the capacitor 164 through the electrode layer 142*a*.

An insulating film 152 is provided over the transistor 162 and the capacitor 164. In addition, a wiring 156 for connecting the transistor 162 to another transistor is provided over the insulating film 152. Although not illustrated in FIG. 5A, the wiring 156 is electrically connected to the wiring layer 138*b* and the electrode layer 142*b* through an electrode formed in an opening provided in the insulating film 150, the insulating film 152, and the like. Here, the electrode is preferably provided so as to partly overlap with at least the oxide semiconductor layer 144 of the transistor 162.

In FIGS. 5A and 5B, the transistors 160 and 162 are provided so as to at least partly overlap each other, and the source region or the drain region of the transistor 160 is preferably provided to partly overlap with the oxide semiconductor layer 144. In addition, the transistor 162 and the capacitor 164 are provided so as to overlap with at least part of the transistor 160. For example, the conductive layer 153 of the capacitor 164 is provided to at least partly overlap with the gate electrode 110 of the transistor 160. When such a planar layout is employed, the area occupied by the semiconductor device can be reduced; thus, the degree of integration can be increased.

Note that the electrical connection between the wiring layer 138*b* and the wiring 156 may be established by direct contact of the wiring layer 138*b* and the wiring 156 with each other or through an electrode provided in an insulating film lying between the wiring layer 138b and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (3rd Line) is electrically connected to one of a source electrode and a drain electrode of the transistor 162, and a fourth wiring (4th Line) is electrically connected to a gate electrode of the transistor 162. A gate electrode of the transistor 160 and the other of the source and drain electrodes of the transistor 162 are electrically connected to one electrode of the capacitor 164. A fifth wiring (5th Line) is electrically connected to the other electrode of the capacitor 164.

The semiconductor device in FIG. 5C utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potential levels (hereinafter referred to as a low-level charge and a high-level charge) is applied. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where the high-level charge is given to the gate electrode of the transistor 160 is lower than an apparent threshold voltage $V_{th\_L}$ in the case where the low-level charge is given to the gate electrode of the transistor 160. Here, an apparent threshold voltage refers to the potential of the fifth wiring which is needed to turn on the transistor 160. Thus, the potential of the fifth wiring is set to a potential $V_0$ which is between $V_{th\_H}$ and $V_{th\_L}$, whereby charge supplied to the gate electrode of the transistor 160 can be determined. For example, in the case where the high-level charge is supplied in writing, when the potential of the fifth wiring is $V_0$ ($>V_{th\_H}$), the transistor 160 is turned on. In the case where the low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, it is necessary that data of only a desired memory cell can be read. In a situation where data is not read, the fifth wirings may be supplied with a potential at which the transistor 160 is turned off regardless of the state of the gate electrode, that is, a potential lower than $V_{th\_H}$. Alternatively, the fifth wirings may be supplied with a potential at which the transistor 160 is turned on regardless of the state of the gate electrode, that is, a potential higher than $V_{th\_L}$.

When including a transistor having a channel formation region formed using an oxide semiconductor and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

As described above, a semiconductor device in which miniaturization and higher integration is achieved and electrical characteristics are high and a method for manufacturing the semiconductor device can be provided.

The configuration, method, and the like described in this embodiment can be combined as appropriate with any of the configurations, methods, and the like described in the other embodiments.

Embodiment 3

In this embodiment, a semiconductor device which includes the transistor described in Embodiment 1, which can hold stored data even when not powered, which has an unlimited number of write cycles, and which has a structure different from the structure described in Embodiment 2 will be described with reference to FIGS. 6A and 6B and FIGS. 7A and 7B.

Figure 6A:
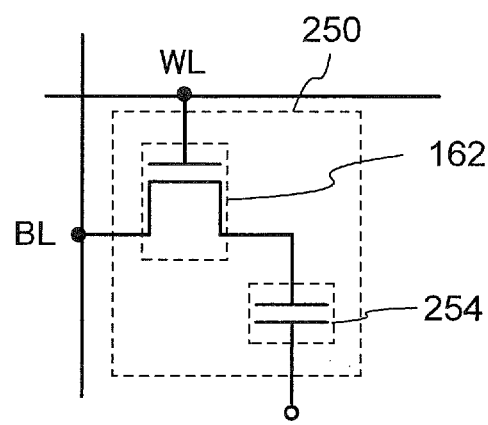
FIGS. 6A and 6B are a circuit diagram and a perspective view illustrating an embodiment of a semiconductor device.
Figure 6B:
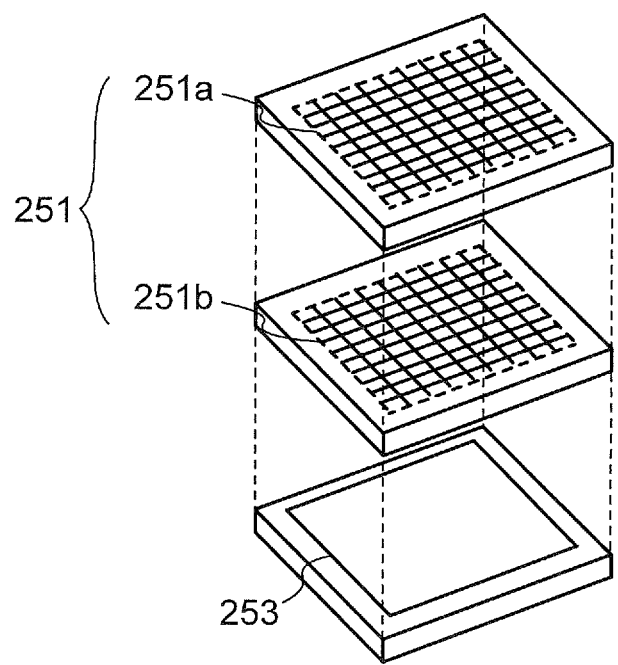

FIG. 6A illustrates an example of a circuit configuration of a semiconductor device, and FIG. 6B is a conceptual diagram illustrating an example of a semiconductor device. First, the semiconductor device illustrated in FIG. 6A will be described, and then, the semiconductor device illustrated in FIG. 6B will be described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 6A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

The transistor 162 including an oxide semiconductor has a characteristic of a extremely small off-state current. For that reason, a potential of the first terminal of the capacitor 254 (or a charge accumulated in the capacitor 254) can be held for an extremely long period by turning off the transistor 162.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0}+C \times V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0}+C \times V_1)/(C_B+C)$) is higher than the potential of the bit line BL in the case of holding the potential $V_0$ ($=(C_B \times V_{B0}+C \times V_0)/(C_B+C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 6B will be described.

The semiconductor device illustrated in FIG. 6B includes memory cell arrays 251a and 251b including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

A transistor provided in the peripheral circuit 253 is preferably formed using a semiconductor material which is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 6B illustrates, as an example, the semiconductor device in which two memory cell arrays 251 (the memory cell array 251a and the memory cell array 251b) are stacked; however, the number of memory cells to be stacked is not limited thereto. Three or more memory cells may be stacked.

Next, a specific structure of the memory cell 250 illustrated in FIG. 6A will be described with reference to FIGS. 7A and 7B.

Figure 7A:
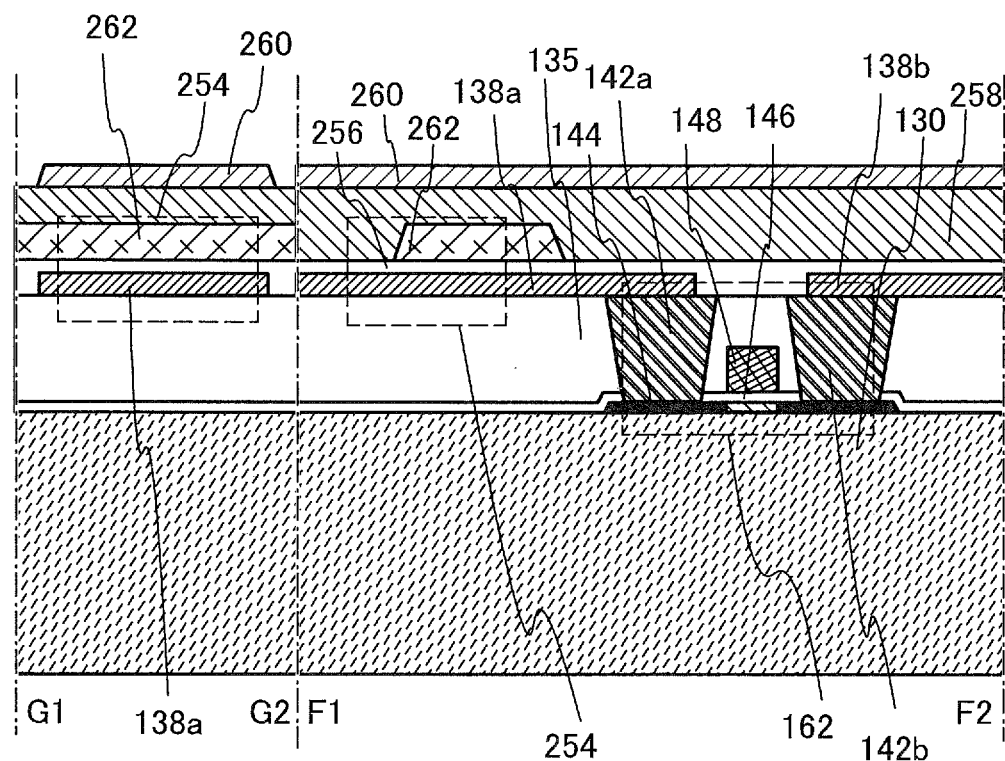
FIGS. 7A and 7B are a cross-sectional view and a plan view illustrating an embodiment of a semiconductor device.
Figure 7B:
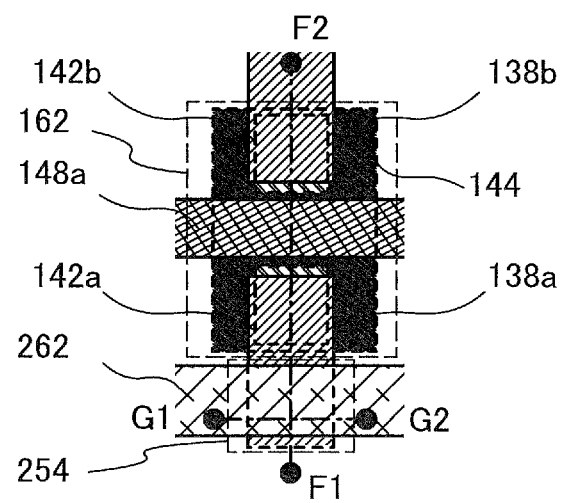

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 illustrated in FIGS. 7A and 7B can have the same structure as the structure described in Embodiment 1.

An insulating film 256 having a single-layer structure or a stacked-layer structure is provided over the transistor 162. In addition, a conductive layer 262 is provided in a region overlapping with the wiring layer 138a which is connected to the electrode layer 142a of the transistor 162 with the insulating film 256 interposed therebetween, and the wiring layer 138a which is connected to the electrode layer 142a, the insulating layer 135, the insulating film 256, and the conductive layer 262 form a capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. In addition, a wiring 260 for connecting the memory cell 250 to an adjacent memory cell 250 is provided over the insulating film 258. Although not illustrated, the wiring 260 is electrically connected to the wiring layer 138a which is connected to the electrode layer 142a of the transistor 162 through an opening provided in the insulating film 256, the insulating film 258, and the like. The wiring 260 may be electrically connected to the wiring layer 138a which is connected to the electrode layer 142a through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell. When such a planar layout is employed, the area occupied by the semiconductor device can be reduced; thus, the degree of integration can be increased.

As described above, the plurality of memory cells is formed in the upper portion with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a semiconductor device in which miniaturization and higher integration is achieved and having high electrical characteristics and a method for manufacturing the semiconductor device can be provided.

This embodiment can be implemented in appropriate combinations with any of the configurations described in the other embodiments.

Embodiment 4

In this embodiment, examples of application of the semiconductor device described in any of the above embodiments to portable devices such as cellular phones, smartphones, or electronic books will be described with reference to FIGS. 8 to 11.

In a portable device such as a cellular phone, a smartphone, or an electronic book, an SRAM or a DRAM is used so as to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 8A:
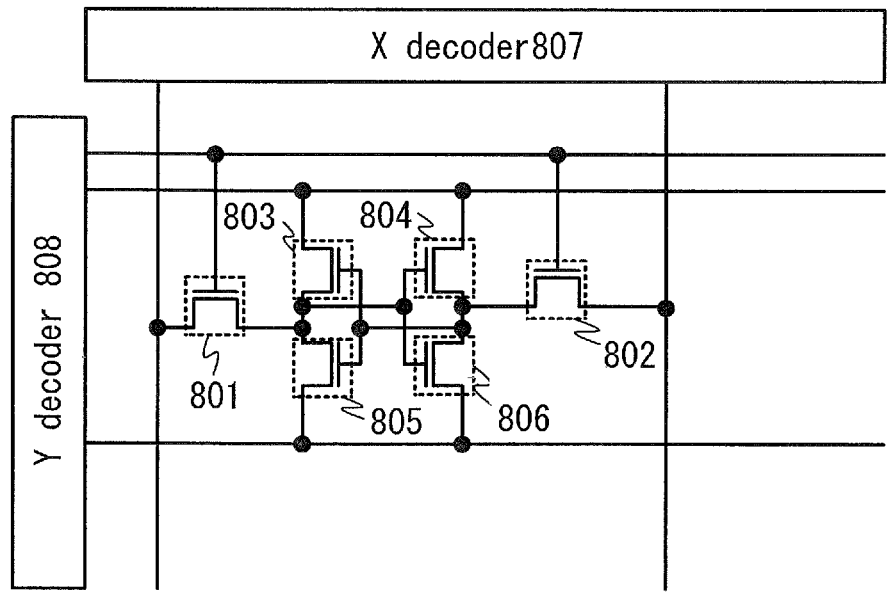
FIGS. 8A and 8B are circuit diagrams illustrating an embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 8B:
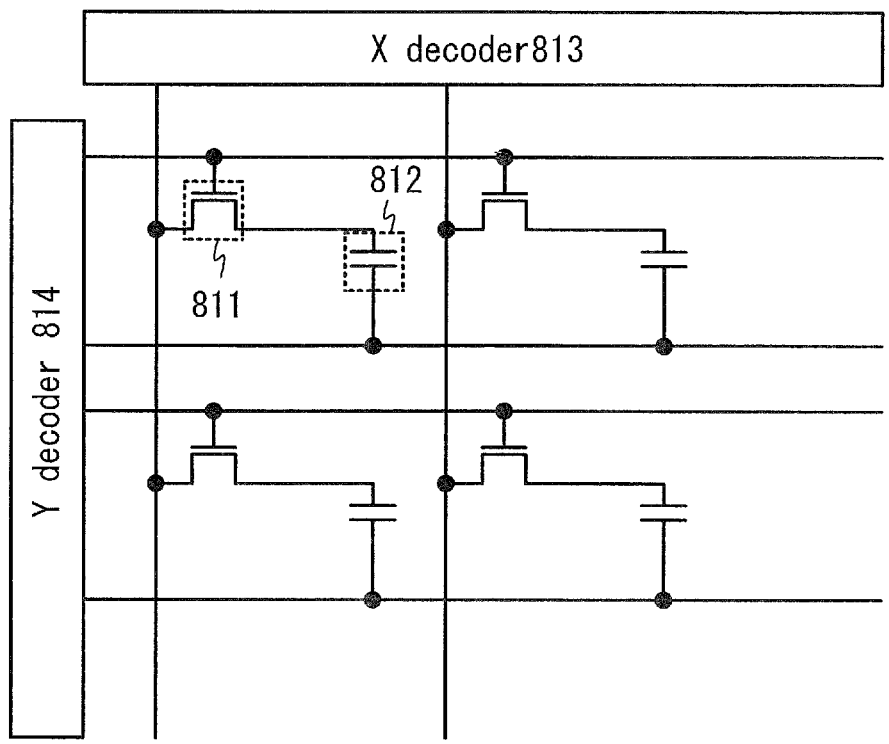

In a DRAM, as illustrated in FIG. 8B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 9:
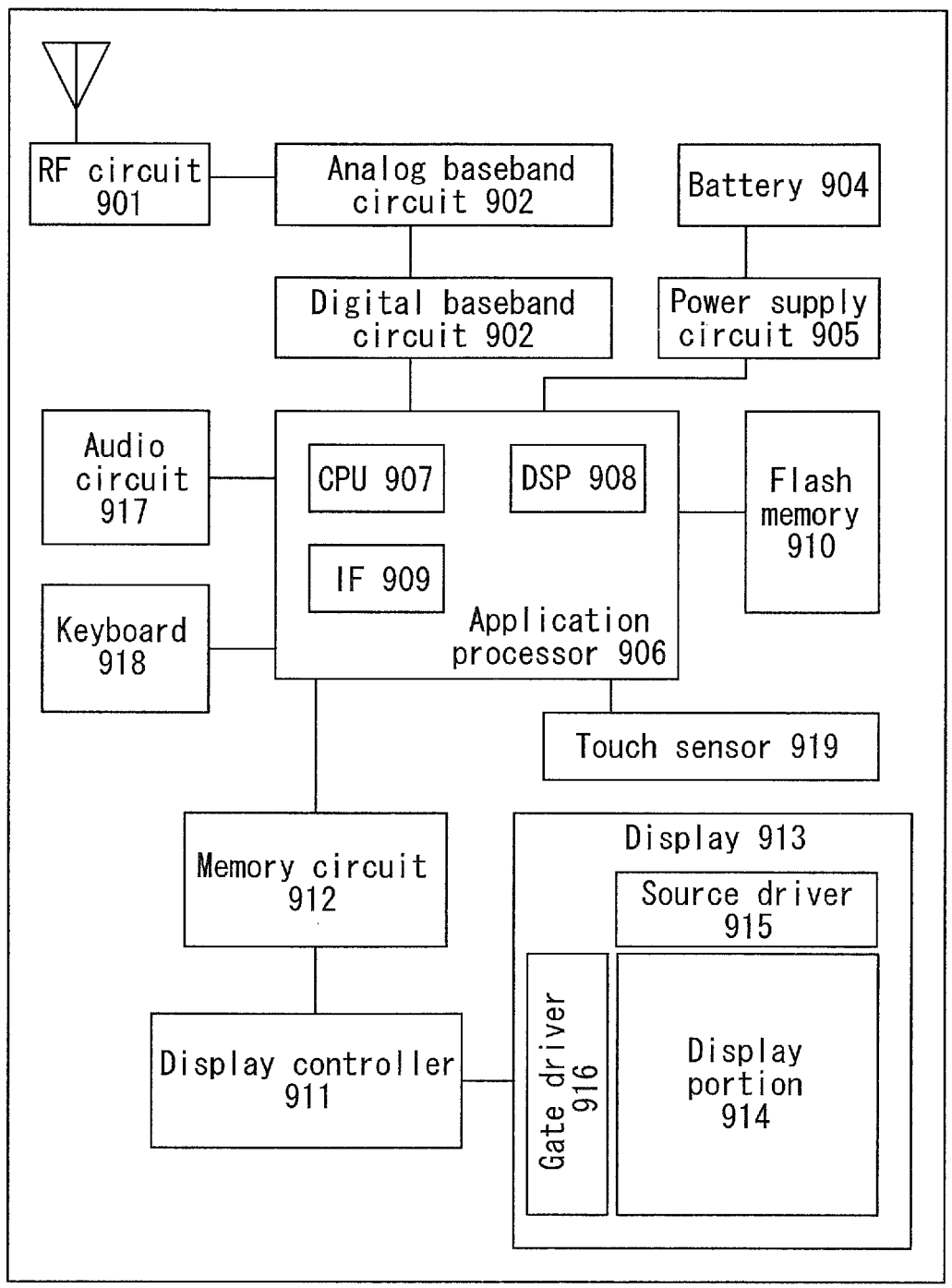
FIG. 9 is a block diagram illustrating an embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 10:
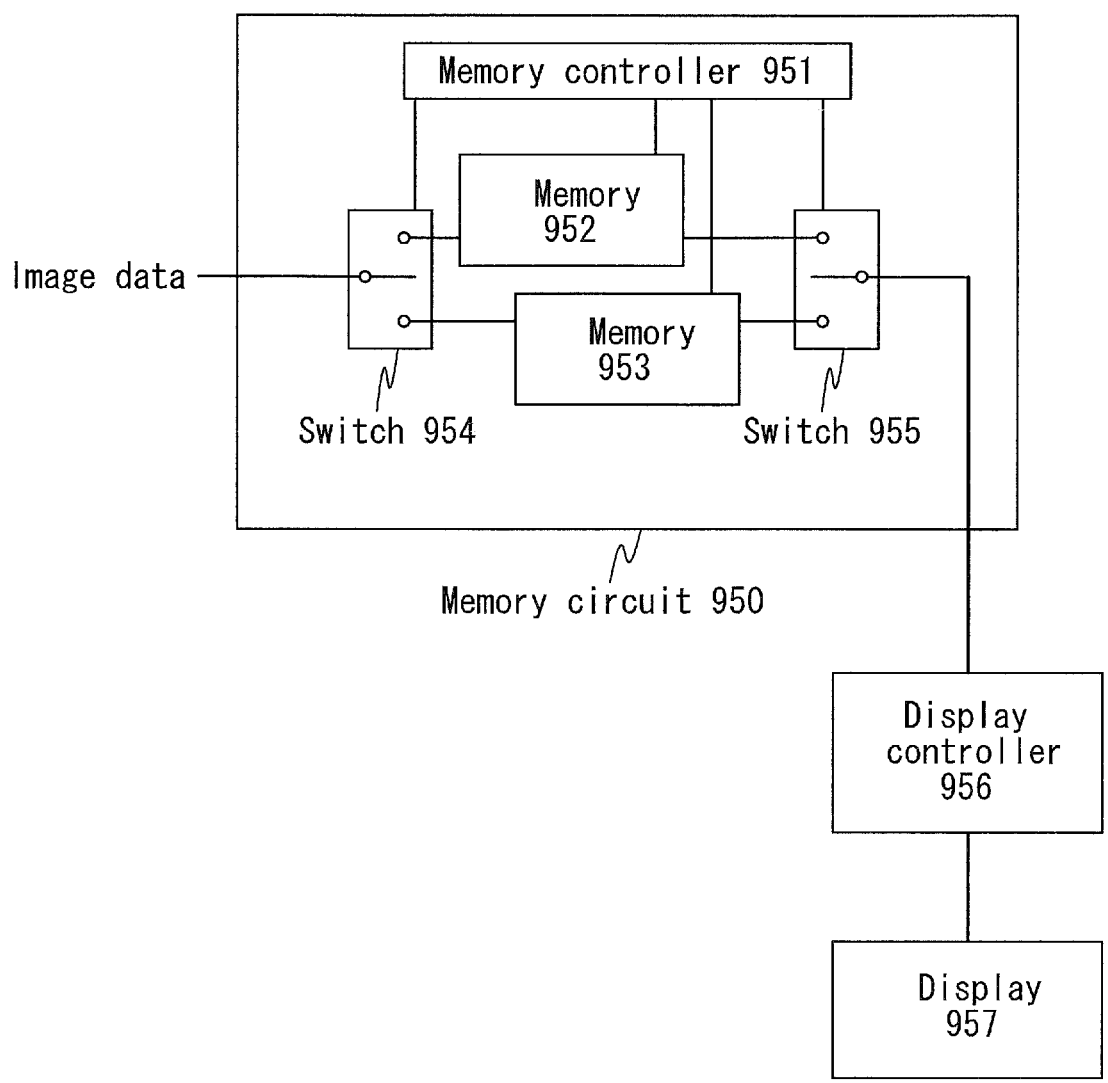
FIG. 10 is a block diagram illustrating an embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 from the display controller 956 usually at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
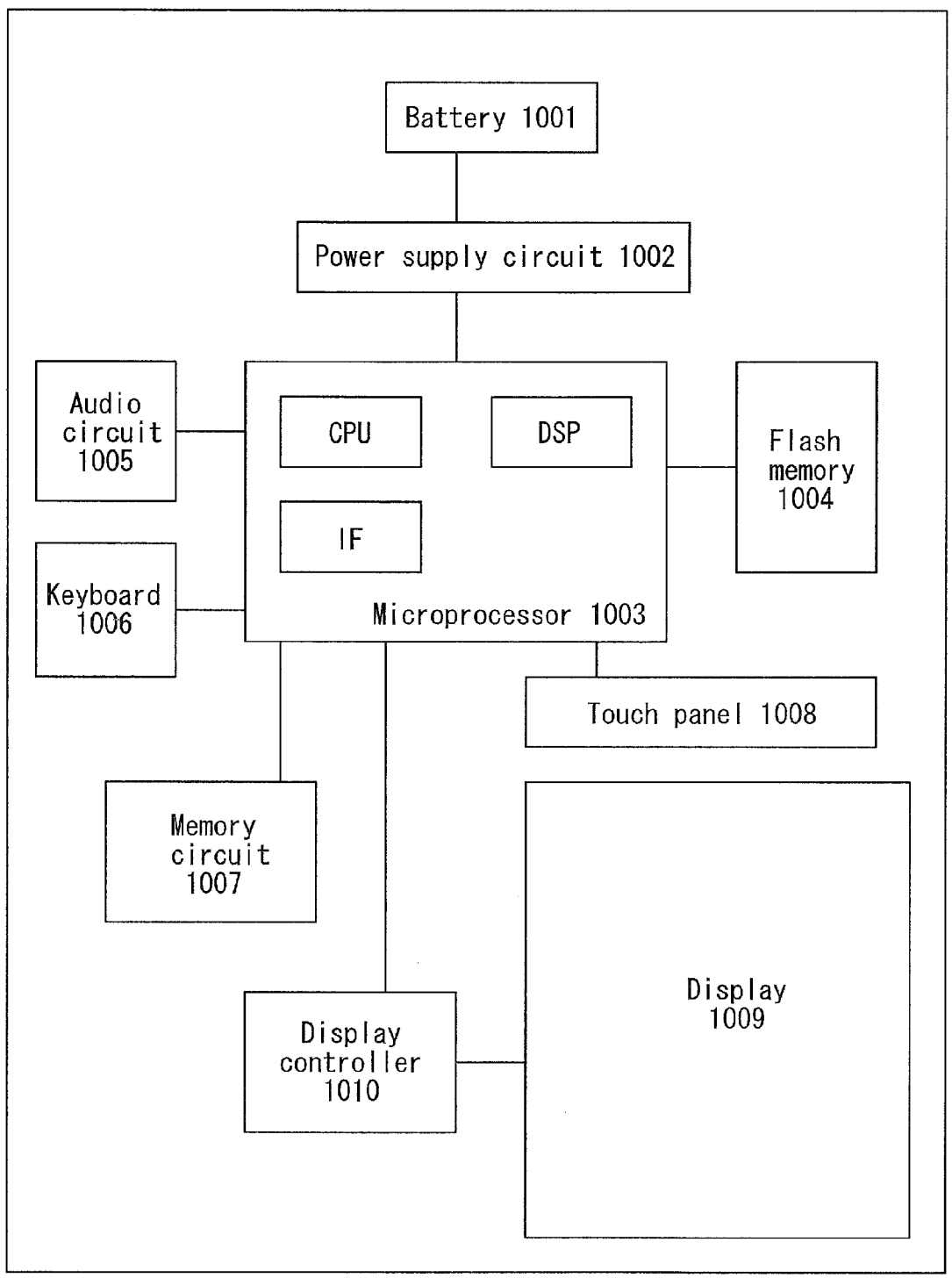
FIG. 11 is a block diagram illustrating an embodiment of a semiconductor device.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, users use a highlight function in some cases. When the user reads an e-book, the user will put a mark on a specific part in some cases. Such a marking function is called a highlighting function, by which characters are changed in color or type, underlined, or bold-faced, for example, so that a specific part is made to look distinct from the other part. In the function, information about the part specified by the user is stored and retained. In the case where the information is stored for a long time, the information may be copied to the flash memory 1004. Even in such a case, by employing the semiconductor device described in any of the above embodiments, writing and reading of data can be performed at high speed, data can be held for a long time, and power consumption can be sufficiently reduced.

As described above, the portable devices described in this embodiment each incorporate the semiconductor device according to any of the above embodiments. Therefore, it is possible to obtain a portable device which is capable of reading data at high speed, holding data for a long time, and reducing power consumption.

The configurations, methods, and the like described in this embodiment can be combined as appropriate with any of the configurations, methods, and the like described in the other embodiments.

Embodiment 5

A semiconductor device with a display function (also referred to as a display device) can be manufactured by using the transistor whose example is described in the above embodiments. Moreover, some or all of the driver circuits which include the transistor can be formed over a substrate where the pixel portion is formed, whereby a system-on-panel can be obtained.

Figure 12A:
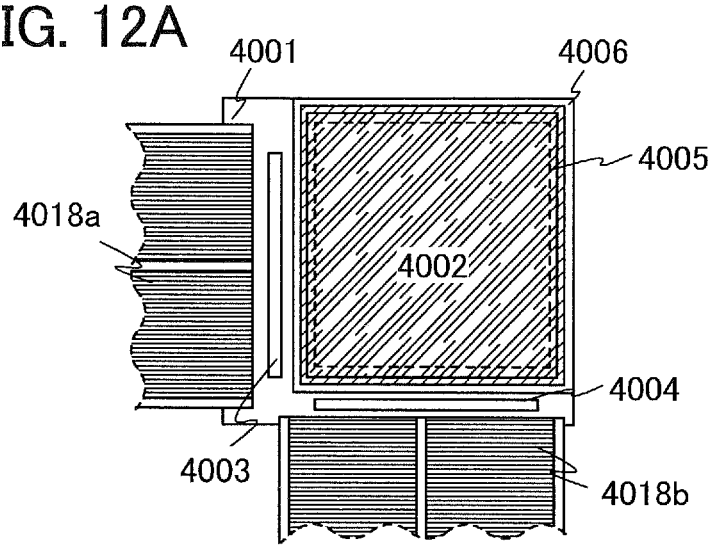
FIGS. 12A to 12C each illustrate an embodiment of a semiconductor device.

In FIG. 12A, a sealant 4005 is provided so as to surround a pixel portion 4002 provided over a first substrate 4001, and the pixel portion 4002 is sealed with a second substrate 4006. In FIG. 12A, a signal line driver circuit 4003 and a scan line driver circuit 4004 which are formed using a single crystal semiconductor film or a polycrystalline semiconductor film over another substrate are mounted in a region that is different from the region surrounded by the sealant 4005 over the first substrate 4001. Various signals and potential are supplied to the signal line driver circuit 4003 and the scan line driver circuit 4004 each of which is separately formed, and to the pixel portion 4002 from flexible printed circuits (FPCs) 4018a and 4018b.

Figure 12B:
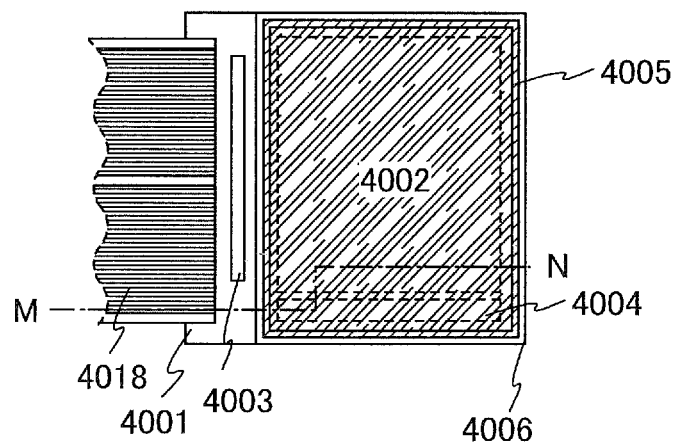
Figure 12C:
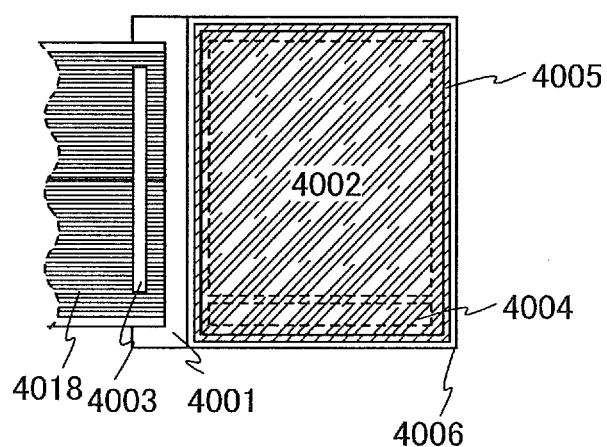

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 12B and 12C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 12B and 12C, various signals and potential are supplied to the signal line driver circuit 4003, the scan line driver circuit 4004, and the pixel portion 4002 from an FPC 4018.

Although FIGS. 12B and 12C each illustrate an example in which the signal line driver circuit 4003 is separately formed and mounted on the first substrate 4001, an embodiment of the invention is not limited to this structure. The scan line driver circuit may be formed separately and then mounted, or only part of the signal line driver circuit or part of the scan line driver circuit may be formed separately and then mounted.

Note that there is no particular limitation on a method of connecting a separately formed driver circuit, and a chip on glass (COG) method, a wire bonding method, a tape automated bonding (TAB) method or the like can be used. FIG. 12A illustrates an example in which the signal line driver circuit 4003 and the scan line driver circuit 4004 are mounted by a COG method. FIG. 12B illustrates an example in which the signal line driver circuit 4003 is mounted by a COG method. FIG. 12C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, or a TCP is attached; a module having a TCP at the tip of which a printed wiring board is provided; and a module in which an integrated circuit (IC) is directly mounted on a display element by a COG method.

Further, the pixel portion and the scan line driver circuit provided over the first substrate includes a plurality of transistors, to which the transistor the example of which is described in the above embodiments can be applied.

As the display element provided in the display device, a liquid crystal element (also referred to as liquid crystal display element) or a light-emitting element (also referred to as light-emitting display element) can be used. The light-emitting element includes, in its category, an element the luminance of which is controlled by current or voltage, and specifically includes, in its category, an inorganic electroluminescence (EL), an organic EL, and the like. Furthermore, a display medium the contrast of which is changed by an electric effect, such as electronic ink, can be used.

Embodiments of a semiconductor device will be described with reference to FIGS. 12A to 12C and FIGS. 13A and 13B. FIGS. 13A and 13B are each a cross-sectional view taken along line M-N in FIG. 12B.

As illustrated in FIGS. 12A to 12C and FIGS. 13A and 13B, the semiconductor device includes a connection terminal electrode 4015 and a terminal electrode 4016. The connection terminal electrode 4015 and the terminal electrode 4016 are electrically connected to a terminal provided for the FPC 4018 via an anisotropic conductive film 4019.

The connection terminal electrode 4015 is formed using the same conductive film as a first electrode layer 4030, and the terminal electrode 4016 is formed using the same conductive film as source and drain wiring layers of transistors 4010 and 4011.

Each of the pixel portion 4002 and the scan line driver circuit 4004 which are provided over the first substrate 4001 includes a plurality of transistors. In FIGS. 12A to 12C and FIGS. 13A and 13B, the transistor 4010 included in the pixel portion 4002 and the transistor 4011 included in the scan line driver circuit 4004 are illustrated as an example. An interlayer insulating film 4020 and an insulating film 4021 are provided over the transistor 4010 and the transistor 4011 in FIG. 13A. Note that an insulating film 4023 is an insulating film serving as a base film. Further, a light-blocking film 4050 is provided in a region which is overlapped with the transistors 4010 and 4011.

The transistor described in the above embodiments can be applied to the transistors 4010 and 4011. This embodiment shows an example in which a transistor having a structure similar to that of the transistor 420 described in Embodiment 1 is used.

In a manufacturing process of the transistors 4010 and 4011, by removing a conductive film provided over the interlayer insulating film 4020 by chemical mechanical polishing treatment, a source electrode layer and a drain electrode layer are formed.

Thus, a distance between the gate electrode layer and the region where the source electrode layer or the drain electrode layer is in contact with the oxide semiconductor layer (a contact region) can be reduced; therefore, the resistance between the gate electrode layer and the region where the source electrode layer or the drain electrode layer is in contact with the oxide semiconductor layer (a contact region) can be reduced, so that on characteristics of the transistors 4010 and 4011 can be improved.

In the step of removing the conductive film over the gate electrode layer in the formation process of the source electrode layer and the drain electrode layer, an etching step using a resist mask is not performed, so that a minute process can be precisely performed. Thus, in the manufacturing process of the semiconductor device, the transistors 4010 and 4011 having little variation in shapes and characteristics and a minute structure can be manufactured with a high yield.

As described above, a semiconductor device with high reliability can be provided as the semiconductor devices illustrated in FIGS. 12A to 12C, and FIGS. 13A and 13B.

Moreover, a conductive layer may be provided so as to overlap with a channel formation region of the oxide semiconductor layer of the transistor 4011 for the driver circuit. The conductive layer is provided so as to overlap with the channel formation region of the oxide semiconductor layer, whereby the amount of change in the threshold voltage of the transistor 4011 before and after a bias-temperature stress test (a BT test) can be further reduced. The conductive layer may have the same potential as or a potential different from that of a gate electrode layer of the transistor 4011, and can function as a second gate electrode layer. The potential of the conductive layer may be GND, 0V, or in a floating state.

In addition, the conductive layer has a function of blocking an external electric field, that is, to prevent an external electric field (particularly, to prevent static electricity) from effecting the inside (a circuit portion including a transistor). A blocking function of the conductive layer can prevent variation in the electrical characteristics of the transistor due to the effect of an external electric field such as static electricity.

The transistor 4010 included in the pixel portion 4002 is electrically connected to a display element to form a display panel. There is no particular limitation on the kind of the display element as long as display can be performed, and various kinds of display elements can be employed.

FIG. 13A illustrates an example of a liquid crystal display device using a liquid crystal element as a display element. In FIG. 13A, a liquid crystal element 4013 which is a display element includes the first electrode layer 4030, a second electrode layer 4031, and a liquid crystal layer 4008. Insulating films 4032 and 4033 serving as orientation films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A spacer 4035 is a columnar spacer which is obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. To increase the temperature range where the blue phase is exhibited, a liquid crystal layer can be formed by adding a polymerizable monomer, a polymerization initiator, and the like to a liquid crystal composition exhibiting a blue phase and by performing a polymer stabilization treatment. The liquid crystal composition exhibiting a blue phase has a short response time, and has optical isotropy, which makes the alignment process unnecessary and the viewing angle dependence small. In addition, since an alignment film does not need to be provided and a rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal composition is greater than or equal to $1\times10^9$ Ω·cm, preferably greater than or equal to $1\times10^{11}$ Ω·cm, more preferably greater than or equal to $1\times10^{12}$ Ω·cm. Note that the specific resistivity in this specification is measured at 20° C.

The capacitance of a storage capacitor formed in the liquid crystal display device is set considering leakage current of the transistor provided in the pixel portion or the like so that charge can be held for a predetermined period. The capacitance of the storage capacitor may be set considering the off-state current of a transistor or the like.

In the transistor including an oxide semiconductor layer used in this embodiment, the current in an off state (off-state current) can be made small. Accordingly, an electrical signal such as an image signal can be held for a longer period in the pixel, and a writing interval can be set longer in an on state. Accordingly, the frequency of refresh operation can be reduced, which leads to an effect of suppressing power consumption.

The field-effect mobility of the transistor including an oxide semiconductor layer used in this embodiment can be high, whereby high-speed operation is possible. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, an advanced super view (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

FIG. 13B illustrates an example of a light-emitting device (a light-emitting panel) using a light-emitting element as a display element. A light-emitting element 4513 which is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. Further, nitrogen is preferably used for the filler, for example.

In addition, if needed, an optical film, such as a polarizing plate, a circularly polarizing plate (including an elliptically polarizing plate), a retardation plate (quarter-wave plate or half-wave plate), or a color filter, may be provided as appropriate on a light-emitting surface of the light-emitting element. Further, the polarizing plate or the circularly polarizing plate may be provided with an anti-reflection film. For example, an anti-glare treatment by which reflected light can be diffused by projections and depressions on the surface so as to reduce the glare can be performed.

Further, an electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A solution in which the above microcapsules are dispersed in a solvent is referred to as electronic ink. Furthermore, by using a color filter or particles that have a pigment, color display can also be achieved.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 12A to 12C and FIGS. 13A and 13B, as the first substrate 4001 and the second substrate 4006, flexible substrates, for example, plastic substrates having a light-transmitting property or the like can be used, other than glass substrates. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

An oxide insulating film can be used as the interlayer insulating film 4020, and the interlayer insulating film 4020 can be formed by a plasma CVD method, a sputtering method, or the like, using silicon oxide, silicon oxynitride, aluminum oxide, aluminum oxynitride, hafnium oxide, gallium oxide, or a mixed material of any of these materials. Further, a nitride insulating film may be stacked over the oxide insulating film, and the nitride insulating film can be formed using any of silicon nitride, silicon nitride oxide, aluminum nitride, aluminum nitride oxide, and a mixed material of any of these.

Note that as a protective film for covering the transistors 4010 and 4011, an aluminum oxide film is preferably used. The protective film can be formed by a sputtering method or a plasma CVD method.

The aluminum oxide film which is provided as the protective film over the oxide semiconductor layer has a high blocking effect by which both of oxygen and impurities such as hydrogen or moisture is prevented from being permeated through the film.

Therefore, in and after the manufacturing process, the aluminum oxide film functions as a protective film for preventing entry of an impurity such as hydrogen or moisture, which causes a change, into the oxide semiconductor layer and release of oxygen, which is a main constituent material of the oxide semiconductor, from the oxide semiconductor layer.

The insulating film 4021 which serves as a planarization insulating film can be formed using an organic material having heat resistance, such as an acrylic resin, polyimide, a benzocyclobutene-based resin, polyamide, or an epoxy. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an ink jet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride of these metals.

A conductive composition containing a conductive high molecule (also called a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying the transistors described in the above-described embodiments as described above, semiconductor devices having a variety of functions can be provided.

This embodiment can be implemented in appropriate combination with the structures described in the other embodiments.

Embodiment 6

A semiconductor device having an image sensor function for reading data of an object can be formed with the use of the transistor an example of which is described in Embodiment 1.

Figure 14A:
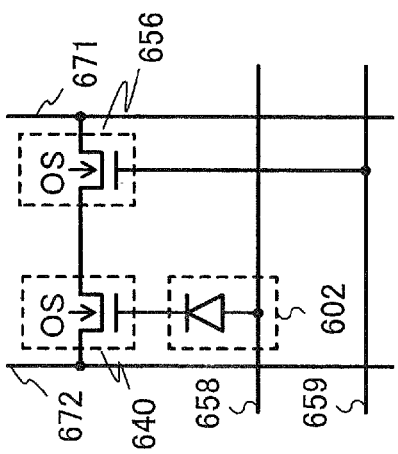
FIGS. 14A and 14B illustrate an embodiment of a semiconductor device.

FIG. 14A illustrates an example of a semiconductor device having an image sensor function. FIG. 14A is an equivalent circuit diagram of a photosensor, and FIG. 14B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, a transistor including an oxide semiconductor layer is denoted by a symbol "OS" so that it can be clearly identified as a transistor including an oxide semiconductor layer. In FIG. 14A, the transistor 640 and the transistor 656 are transistors each including an oxide semiconductor layer, to which any of the transistors described in the above embodiments can be applied. Described in this embodiment is an example in which a transistor having a structure similar to that of the transistor 420 described in Embodiment 1 is used.

Figure 14B:
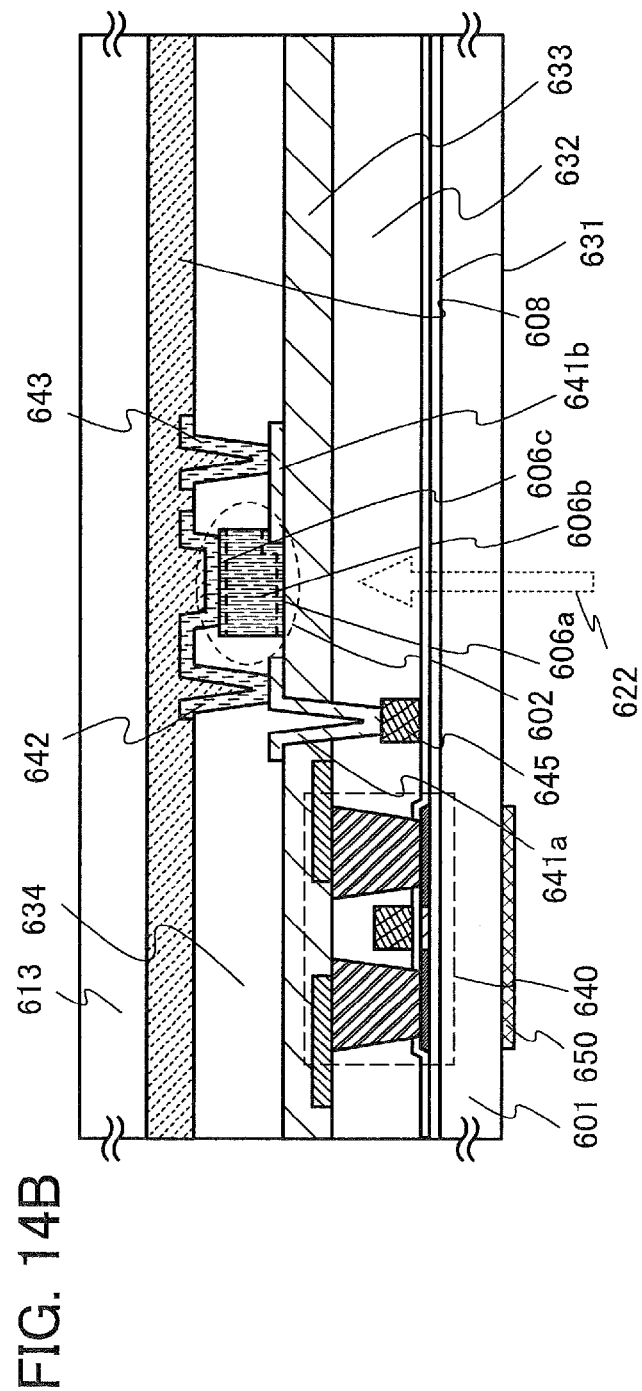

FIG. 14B is a cross-sectional diagram of the photodiode 602 and the transistor 640 in the photosensor. The transistor 640 and the photodiode 602 functioning as a sensor are provided over a substrate 601 (TFT substrate) having an insulating surface. A substrate 613 is provided over the photodiode 602 and the transistor 640 with the use of an adhesive layer 608.

An interlayer insulating film 632, an insulating film 633, and an interlayer insulating film 634 are provided over the transistor 640 provided over an insulating film 631. The photodiode 602 is provided over the insulating film 633. In the photodiode 602, a first semiconductor film 606a, a second semiconductor film 606b, and a third semiconductor film 606c are stacked in this order from the insulating film 633 side, between electrode layers 641a and 641b formed over the insulating film 633 and an electrode layer 642 formed over the interlayer insulating film 634.

Note that a light-blocking film 650 is provided in a region with which the transistor 640 is overlapped.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as a method of forming the amorphous silicon film, an LPCVD method, a vapor deposition method, a sputtering method, or the like is used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) can be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as the method of forming the amorphous silicon film, an LPCVD method, a chemical vapor deposition method, a sputtering method, or the like is used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline (semi-amorphous: SAS) semiconductor.

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma-enhanced CVD method with a frequency of greater than or equal to several tens of megahertz and less than or equal to several hundreds of megahertz, or a microwave plasma-enhanced CVD apparatus with a frequency of greater than or equal to 1 GHz. As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is formed using a light-blocking conductive film. A surface on the n-type semiconductor film side can alternatively be used as the light-receiving plane.

With the use of an insulating material, the insulating film 631, the interlayer insulating film 632, and the insulating film 633 can be formed, depending on the material, by a method or a tool (equipment) such as a sputtering method, a plasma-enhanced CVD method, an SOG method, spin coating, dipping, spray coating, a droplet discharge method (such as an ink jet method), a printing method (such as screen printing or offset printing), a doctor knife, a roll coater, a curtain coater, or a knife coater.

In this embodiment, an aluminum oxide film is used as the insulating film 633. The insulating film 633 can be formed by a sputtering method or a plasma-enhanced CVD method.

The aluminum oxide film which is provided as the insulating film 633 over the oxide semiconductor layer has a high blocking effect by which both of oxygen and impurities such as hydrogen or moisture is prevented from being permeated through the film.

Therefore, in and after the manufacturing process, the aluminum oxide film functions as a protective film for preventing entry of an impurity such as hydrogen or moisture, which causes a change, into the oxide semiconductor layer and release of oxygen, which is a main constituent material of the oxide semiconductor, from the oxide semiconductor layer.

In this embodiment, in a manufacturing process of the transistor 640, by removing a conductive film provided over the interlayer insulating film 632 by chemical mechanical polishing treatment and dividing the conductive film, a source electrode layer and a drain electrode layer are formed.

Thus, a distance between the gate electrode layer and the region where the source electrode layer or the drain electrode layer is in contact with the oxide semiconductor layer (a contact region) can be reduced; therefore, the resistance between the gate electrode layer and the region where the source electrode layer or the drain electrode layer is in contact with the oxide semiconductor layer (a contact region) can be reduced, so that on characteristics of transistor 640 can be improved.

In the step of removing the conductive film over the gate electrode layer in the formation process of the source electrode layer and the drain electrode layer, an etching process using a resist mask is not performed, so that a minute process can be precisely performed. Thus, in the manufacturing process of the semiconductor device, the transistor 640 having little variation in shapes and characteristics and a minute structure can be manufactured with a high yield.

The insulating film 631, the interlayer insulating film 632, and the insulating film 633 can be formed using an inorganic insulating material and can have a single-layer structure or a stacked-layer structure including any of oxide insulating films such as a silicon oxide film, a silicon oxynitride film, an aluminum oxide film, and an aluminum oxynitride film; and nitride insulating films such as a silicon nitride film, a silicon nitride oxide film, an aluminum nitride film, and an aluminum nitride oxide film.

To reduce surface roughness, an insulating film functioning as a planarization insulating film is preferably used as the interlayer insulating film 634.

With detection of light that enters the photodiode 602, data on an object to be detected can be read. A light source such as a backlight can be used at the time of reading data on the object to be detected.

As described above, a semiconductor device in which miniaturization and higher integration is achieved and having high electrical characteristics and a method for manufacturing the semiconductor device can be provided.

This embodiment can be implemented in appropriate combination with the structures described in the other embodiments.

Embodiment 7

In this embodiment, electronic devices according to an embodiment of the present invention will be described. Specifically, electronic devices on each of which a display panel or a light-emitting panel including a transistor shown in the above embodiment is mounted are described with reference to FIGS. 15A to 15F.

Examples of the electronic devices to which the semiconductor device is applied are television sets (also referred to as televisions or television devices), monitors of computers or the like, cameras such as digital cameras and digital video cameras, digital photo frames, mobile phones (also referred to as cell phones or cellular phones), portable game consoles, personal digital assistants, audio reproducing devices, and large-sized game machines such as pachinko machines. Specific examples of these electronic devices are illustrated in FIGS. 15A to 15F.

Figure 15A:
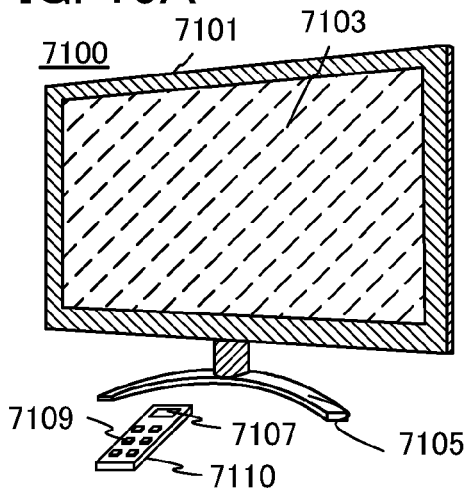
FIGS. 15A to 15F each illustrate an electronic device.

FIG. 15A illustrates an example of a television set. In a television set 7100, a display portion 7103 is incorporated in a housing 7101. Images can be displayed on the display portion 7103, and the display panel can be used for the display portion 7103. Here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television set 7100 is provided with a receiver, a modem, and the like. A general television broadcast can be received with the receiver. When the television set 7100 is connected to a communication network with or without wires via the modem, one-way (from a sender to a receiver) or two-way (between a sender and a receiver or between receivers) information communication can be performed.

Figure 15B:
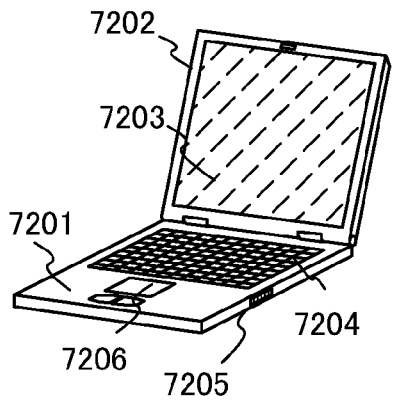

FIG. 15B illustrates a computer that includes a main body 7201, a housing 7202, a display portion 7203, a keyboard 7204, an external connection port 7205, a pointing device 7206, and the like. This computer is fabricated using the display panel for the display portion 7203.

Figure 15C:
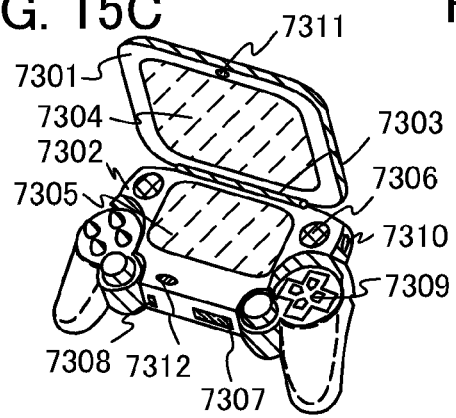

FIG. 15C illustrates a portable game console that includes two housings, a housing 7301 and a housing 7302, which are connected with a joint portion 7303 so that the portable game console can be opened or folded. A display portion 7304 is incorporated in the housing 7301, and a display portion 7305 is incorporated in the housing 7302. The portable game console in FIG. 15C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game console can include other accessories as appropriate as long as the display panel is used for at least one of the display portions 7304 and 7305. The portable game console in FIG. 15C has a function of reading a program or data stored in a recording medium to display it on the display portion, and a function of sharing information with another portable game console by wireless communication. The portable game console in FIG. 15C can have a variety of functions without limitation to the above functions.

Figure 15D:
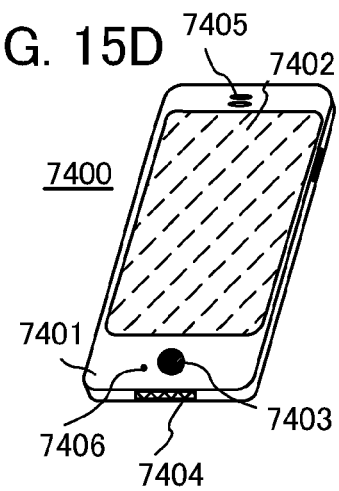

FIG. 15D illustrates an example of a mobile phone. A mobile phone 7400 includes a display portion 7402 incorporated in a housing 7401, an operation button 7403, an external connection port 7404, a speaker 7405, a microphone 7406, and the like. The mobile phone 7400 is fabricated using the display panel for the display portion 7402.

When the display portion 7402 of the mobile phone 7400 in FIG. 15D is touched with a finger or the like, data can be input into the mobile phone 7400. Operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating an e-mail, a text input mode mainly for inputting text is selected for the display portion 7402 so that text displayed on the screen can be input. In that case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation button 7403 of the housing 7401. Moreover, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

In the input mode, when input by touching the display portion 7402 is not performed within a specified period while a signal is detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. When a backlight or a sensing light source that emits near-infrared light is provided in the display portion, an image of a finger vein, a palm vein, or the like can be taken.

Figure 15E:
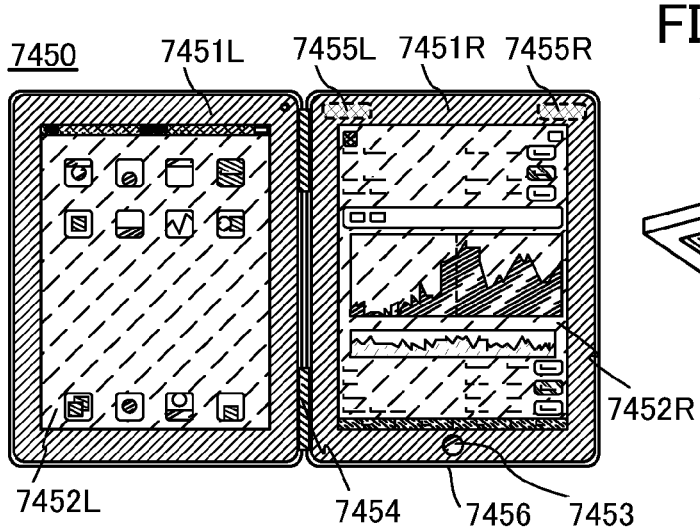

FIG. 15E illustrates an example of a flat-plate-shaped computer. A flat-plate-shaped computer 7450 includes a housing 7451L and a housing 7451R connected by hinges 7454. The flat-plate-shaped computer 7450 further includes an operation button 7453, a left speaker 7455L, and a right speaker 7455R. In addition, a side surface of the flat-plate-shaped computer 7450 is provided with an external connection port 7456, which is not illustrated. Note that when the flat-plate-shaped computer is folded on the hinges 7454 so that the display portion 7452L provided in the housing 7451L and the display portion 7452R provided in the housing 7451R can face each other, the display portions can be protected by the housings.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another device connected to the network from a distant place.

Figure 15F:
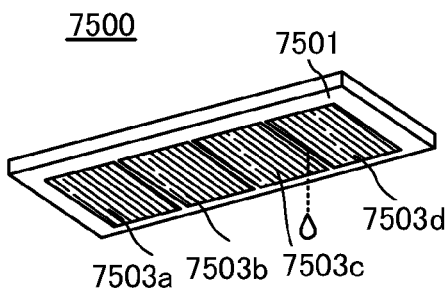

FIG. 15F illustrates an example of a lighting device. In a lighting device 7500, light-emitting panels 7503a to 7503d of one embodiment of the present invention are incorporated in a housing 7501 as light sources. The lighting device 7500 can be attached to a ceiling, a wall, or the like.

The light-emitting panel of one embodiment of the present invention includes a light-emitting device in a thin film form. Thus, when the light-emitting device is attached to a base with a curved surface, a semiconductor device with a curved surface can be obtained. In addition, when the light-emitting panel is located in a housing with a curved surface, an electronic device or a lighting device with a curved surface can be obtained.

This embodiment can be implemented in appropriate combination with the structures described in the other embodiments.

Example

In this example, the transistor described in Embodiment 1 was formed and the electric characteristics of the transistor were evaluated.

A manufacturing method of a transistor used in this example will be described below.

First, a silicon substrate was carried into a sputtering apparatus, and reverse sputtering was performed for 3 minutes under an argon atmosphere (the flow of 50 sccm) with the pressure of 0.6 Pa and the electric power (power output) of 200 W to planarize a surface of the silicon substrate. After that, as a base insulating layer, a silicon oxide film having a thickness of 300 nm was successively formed by a sputtering method without exposure to the air. Deposition conditions of the silicon oxide film were set as follows: oxygen atmosphere (the flow of 50 sccm), pressure of 0.4 Pa; electric power (power output), 1.5 kW; distance between the silicon substrate and a target, 60 mm; and substrate temperature, 100° C.

Next, as an oxide semiconductor layer, an IGZO film having a thickness of 20 nm was formed by a sputtering method over the base insulating layer with the use of an oxide target having a composition ratio of In:Ga:Zn=3:1:2 [atomic ratio]. Deposition conditions were set as follows: mixed atmosphere, argon and oxygen (Ar:$O_2$=30 sccm:15 sccm); pressure, 0.4 Pa; electric power, 0.5 kW; and substrate temperature, 200° C.

Oxygen ions were implanted into the formed oxide semiconductor layer by an ion implantation method. The conditions of the oxygen ion implantation were as follows: acceleration voltage, 5 kV; a dosage, $5.0 \times 10^{15}$ ions/cm$^2$; a tilt angle, 7°; and a twist angle, 72°.

After that, the oxide semiconductor layer was processed into an island shape by an inductively coupled plasma (ICP) etching. Etching conditions were set as follows: etching gas, a mixed gas of boron trichloride and chlorine ($BCl_3$:$Cl_2$=60 sccm: 20 sccm); electric power, 450 W; bias power, 100 W; and pressure, 1.9 Pa.

Next, as a gate insulating layer, a silicon nitride oxide film having a thickness of 20 nm was formed by a CVD method over the island-shaped oxide semiconductor layer.

A gate electrode layer was formed by stacking a tantalum nitride film having a thickness of 30 nm and a tungsten film having a thickness of 135 nm by a sputtering method over the gate insulating layer and processing the stack by an etching method. Deposition conditions of the tantalum nitride film were set as follows: mixed atmosphere, argon and nitrogen (Ar:$N_2$=50 sccm:10 sccm); pressure, 0.6 Pa; and electric power, 1 kW. Deposition conditions of the tungsten film were set as follows: argon atmosphere (the flow of 100 sccm); pressure, 2.0 Pa; electric power, 4 kW; and heated argon gas which was introduced to heat the substrate, 10 sccm.

The tantalum nitride film and the tungsten film were subjected to first to third etching. The first etching was performed under the following conditions: etching gas, a mixed gas of chlorine, carbon tetrafluoride, and oxygen ($Cl_2$:$CF_4$:$O_2$=45 sccm:55 sccm:55 sccm); electric power, 3 kW; bias power, 110 W; pressure, 0.67 Pa; and substrate temperature, 40° C. Accordingly, the tungsten film was etched. After that, the second etching was performed for 15 seconds under the following conditions: etching gas, a chlorine gas ($Cl_2$=100 sccm); electric power, 2 kW; bias power, 50 W; and substrate temperature, −10° C. Then, the third etching was performed for 50 seconds under the following conditions: etching gas, a chlorine gas ($Cl_2$=100 sccm); electric power, 1 kW; bias power, 25 W; and substrate temperature, −10° C. Accordingly, the tantalum nitride film was etched.

Next, phosphorus (P) ion implantation was performed on the oxide semiconductor layer by an ion implantation method with the use of the gate electrode layer as a mask, so that a pair of low-resistance regions and a channel formation region sandwiched between the pair of low-resistance regions were formed in a self-aligned manner. Note that the conditions of the phosphorus (P) ion implantation were set as follows: acceleration voltage, 30 kV; and dosage, $1.0 \times 10^{15}$ ions/cm$^2$.

Next, as an insulating layer, an aluminum oxide film and a silicon nitride oxide film were stacked in this order over the oxide semiconductor layer and the gate electrode layer. The aluminum oxide film was formed by a sputtering method, and the thickness was set to 25 nm. The deposition conditions of the aluminum oxide film were as follows: mixed atmosphere, an argon gas and an oxygen gas (Ar:$O_2$=25 sccm:25 sccm); the pressure, 0.4 Pa; electric power (power output), 2.5 kW; the distance between the silicon substrate and the target, 60 mm; and the substrate temperature, 250° C. After that, the silicon nitride oxide film was formed with a thickness of 350 nm by a CVD method over the aluminum oxide film.

A resist mask was formed over the insulating layer, and the insulating layer and the gate insulating layer was etched by an ICP etching method, so that an opening which reaches one of the low-resistance regions was formed. First etching conditions for forming the opening were as follows: etching gas, a mixed gas of trifluoromethane and helium ($CHF_3$:

He=7.5 sccm:142.5 sccm); electric power, 470 W; bias power, 300 W; and the pressure, 5.5 Pa. After that, the bias power was changed to 150 W to perform the second etching was performed.

After the resist mask was removed, another resist mask was formed over the insulating layer, and the insulating layer and the gate insulating layer were etched by an ICP etching method, so that an opening which reaches the other of the low-resistance regions was formed. The etching conditions for forming the opening were the same conditions as described above.

A tungsten film with the thickness of 600 nm was formed in the opening by a sputtering method. The deposition conditions of the tungsten film were as follows: the atmosphere was an argon atmosphere (flow rate is 80 sccm); the pressure was 0.8 Pa; electric power was 1 kW; and heated argon gas at the flow rate of 10 sccm was flowed for heating the substrate.

Next, CMP treatment was performed on the tungsten film and the tungsten film which was provided over the insulating layer (at least a region which was overlapped with the gate electrode layer) was removed, so that a source electrode layer and a drain electrode layer which were embedded in openings were formed. The conditions of the CMP treatment were as follows: a polishing pad for CMP, a polyurethane-based polishing cloth; a slurry, SSW2000 (produced by Cabot Corporation) to which 4 vol % of an hydrogen peroxide solution was added; a polishing pressure of 0.08 MPa; and a number of spindle rotations on a side where the substrate is fixed and the number of rotations of a table where a polishing cloth is fixed each of 50 rpm.

Next, a conductive film was formed over the source electrode layer and the drain electrode layer and the conductive film was processed, so that a source wiring layer and a drain wiring layer were formed. The conductive film had a structure in which a titanium film with a thickness of 50 nm, an aluminum film with a thickness of 100 nm, and a titanium film with a thickness of 50 nm were stacked. The deposition conditions of the titanium film were as follows: the atmosphere, an argon atmosphere (flow rate was 20 sccm); the pressure, 0.1 Pa; the source voltage, 12 kW; and the temperature, room temperature. Further, the deposition conditions of the aluminum film were as follows: the atmosphere, an argon atmosphere (flow rate as 50 sccm); the pressure, 0.4 Pa; the source voltage, 1 kW; and the temperature, room temperature.

Further, an ICP etching method was used for the etching of the conductive film. The etching conditions were as follows: the etching gas, boron trichloride and chlorine ($BCl_3$:$Cl_2$=60 sccm:20 sccm); electric power, 450 W; bias power, 100 W; and pressure, 1.9 Pa.

After that, a polyimide film with a thickness of 1.5 μm was formed by a coating method, and heat treatment was performed at 300° C. in an atmospheric atmosphere for one hour.

Through the above process, the transistor of this example was manufactured.

Note that in the transistor in this example, a channel length (L) was 0.25 μm, a channel width (W) was 10 μm, and a distance between a source side contact region and a gate electrode layer and a distance between a drain side contact region and a gate electrode layer were each 0.05 μm.

Figure 16:
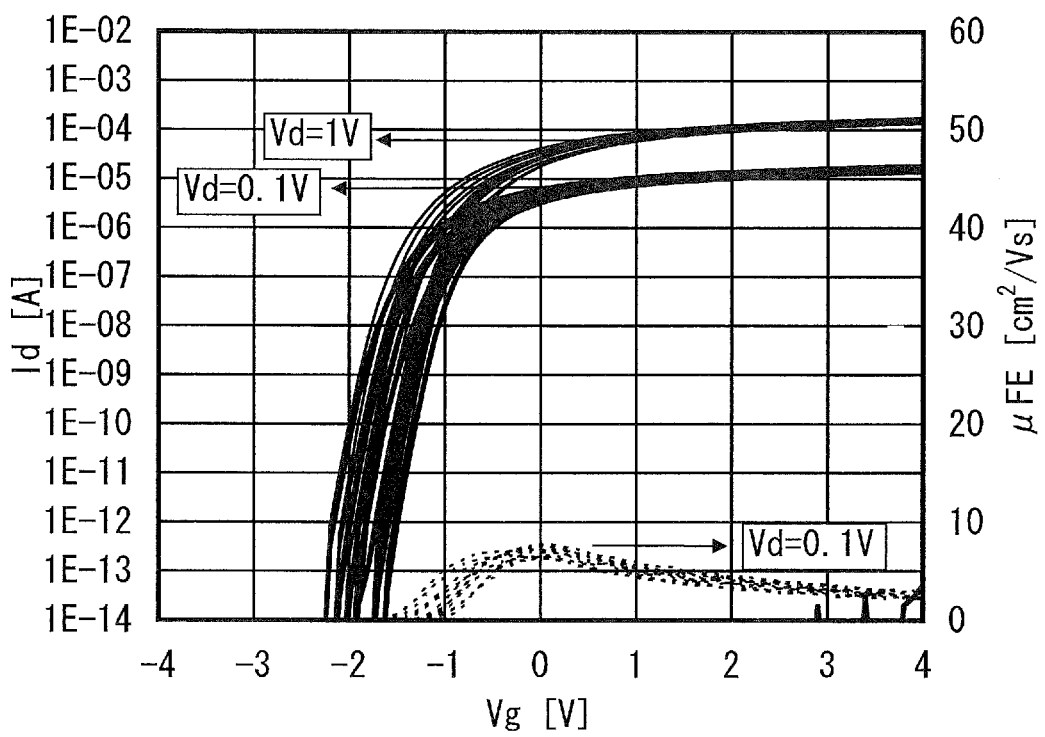
FIG. 16 is a graph showing evaluation results of electrical characteristics of a transistor in Example.

FIG. 16 show measurement results of electrical characteristics of the transistors manufactured in this example. Electrical characteristics shown in FIG. 16 is measurement results of values of drain current (Id: [A]) and field-effect mobility (μFE: [$cm^2$/Vs]) when drain voltage (Vd) was set to 1 V or 0.1 V and gate voltage (Vg) was set to range from −4 V to 4 V. Note that drain voltage (Vd) refers to a potential difference between a drain and a source when the potential of the source is used as a reference potential.

As illustrated in FIG. 16, the transistor in this example shows electrical characteristics of a switching element. Further, the average values (sample number n=12) of electrical characteristics in the case where drain voltage (Vd) of the transistor in this example is 1 V are as follows: the threshold voltage, −1.2 V; an S value (a subthreshold value), 93.0 mV/dec; and field effect mobility, 7.2 $cm^2$/Vs. In the case where drain voltage (Vd) is 1 V and gate voltage (Vg) is 2.7 V, an on current value is 126.8 μA.

The above results suggested that the transistor in this example has high electrical characteristics even in the case of a minute structure.

This application is based on Japanese Patent Application serial no. 2011-208240 filed with Japan Patent Office on Sep. 23, 2011, and Japanese Patent Application serial no. 2011-225900 filed with Japan Patent Office on Oct. 13, 2011, the entire contents of which are hereby incorporated by reference.

What is claimed is:

1. A method for manufacturing a semiconductor device comprising the steps of:
    forming a semiconductor layer over an insulating surface;
    forming a gate insulating layer over the semiconductor layer;
    forming a gate electrode layer over the semiconductor layer with the gate insulating layer provided therebetween;
    forming an insulating layer over the gate electrode layer;
    forming a first opening reaching the semiconductor layer by etching the insulating layer and the gate insulating layer by a first lithography step;
    forming a second opening reaching the semiconductor layer so that the gate electrode layer is between the first opening and the second opening by etching the insulating layer and the gate insulating layer by a second lithography step after formation of the first opening;
    forming a conductive film simultaneously in the first opening, the second opening, and on the insulating layer;
    forming a source electrode layer and a drain electrode layer from the conductive film, the source electrode layer and the drain electrode layer filling the first opening and the second opening, respectively; and
    forming a source wiring layer and a drain wiring layer on and in contact with the source electrode layer and the drain electrode layer, respectively,
    wherein a distance in a channel formation region length direction between the source electrode layer and the drain electrode layer is shorter than a distance in the channel formation region length direction between the source wiring layer and the drain wiring layer.

2. A method for manufacturing a semiconductor device comprising the steps of:
    forming a semiconductor layer over an insulating surface;
    forming a gate insulating layer over the semiconductor layer;
    forming a gate electrode layer over the semiconductor layer with the gate insulating layer provided therebetween;
    forming an insulating layer over the gate electrode layer;
    forming a first mask on the insulating layer;

forming a first opening reaching the semiconductor layer by etching the insulating layer and the gate insulating layer with use of the first mask;
removing the first mask;
forming a second mask on the insulating layer and in the first opening;
forming a second opening reaching the semiconductor layer by etching the insulating layer and the gate insulating layer with use of the second mask, so that the gate electrode layer is between the first opening and the second opening;
removing the second mask;
forming a conductive film simultaneously in the first opening, the second opening, and on the insulating layer;
forming a source electrode layer and a drain electrode layer from the conductive film, the source electrode layer and the drain electrode layer filling the first opening and the second opening, respectively; and
forming a source wiring layer and a drain wiring layer on and in contact with the source electrode layer and the drain electrode layer, respectively,
wherein a distance in a channel formation region length direction between the source electrode layer and the drain electrode layer is shorter than a distance in the channel formation region length direction between the source wiring layer and the drain wiring layer.

3. The method for manufacturing a semiconductor device according to claim 2,
wherein a polishing treatment on the conductive film is performed so as to form the source electrode layer in the first opening and the drain electrode layer in the second opening, the source electrode layer being separated from the drain electrode layer.

4. A method for manufacturing a semiconductor device comprising the steps of:
forming a semiconductor layer over an insulating surface;
forming a gate insulating layer over the semiconductor layer;
forming a gate electrode layer over the semiconductor layer with the gate insulating layer provided therebetween;
forming an insulating layer over the gate electrode layer;
forming a first opening reaching the semiconductor layer by etching the insulating layer and the gate insulating layer by a first lithography step;
forming a second opening reaching the semiconductor layer so that the gate electrode layer is between the first opening and the second opening by etching the insulating layer and the gate insulating layer by a second lithography step after formation of the first opening;
forming a conductive film simultaneously in the first opening, the second opening, and on the insulating layer;
performing a polishing treatment on the conductive film so as to form a source electrode layer in the first opening and a drain electrode layer in the second opening, the source electrode layer being separated from the drain electrode layer, and
forming a source wiring layer and a drain wiring layer on and in contact with the source electrode layer and the drain electrode layer, respectively,
wherein a distance in a channel formation region length direction between the source electrode layer and the drain electrode layer is shorter than a distance in the channel formation region length direction between the source wiring layer and the drain wiring layer.

5. The method for manufacturing a semiconductor device according to claim 1,
wherein the semiconductor layer is an oxide semiconductor layer.

6. The method for manufacturing a semiconductor device according to claim 2,
wherein the semiconductor layer is an oxide semiconductor layer.

7. The method for manufacturing a semiconductor device according to claim 4,
wherein the semiconductor layer is an oxide semiconductor layer.

8. The method for manufacturing a semiconductor device according to claim 3,
wherein a chemical mechanical polishing treatment is used for the polishing treatment of the conductive film.

9. The method for manufacturing a semiconductor device according to claim 4,
wherein a chemical mechanical polishing treatment is used for the polishing treatment of the conductive film.

10. The method for manufacturing a semiconductor device according to claim 1,
wherein an impurity is introduced into the semiconductor layer by using the gate electrode layer as a mask before the insulating layer is formed, and
wherein a first low-resistance region, a second low-resistance region, and a channel formation region sandwiched between the first low-resistance region and the second low-resistance region are formed in the semiconductor layer in a self-aligned manner.

11. The method for manufacturing a semiconductor device according to claim 2,
wherein an impurity is introduced into the semiconductor layer by using the gate electrode layer as a mask before the insulating layer is formed, and
wherein a first low-resistance region, a second low-resistance region, and a channel formation region sandwiched between the first low-resistance region and the second low-resistance region are formed in the semiconductor layer in a self-aligned manner.

12. The method for manufacturing a semiconductor device according to claim 4,
wherein an impurity is introduced into the semiconductor layer by using the gate electrode layer as a mask before the insulating layer is formed, and
wherein a first low-resistance region, a second low-resistance region, and a channel formation region sandwiched between the first low-resistance region and the second low-resistance region are formed in the semiconductor layer in a self-aligned manner.

13. The method for manufacturing an electronic device comprising the method for manufacturing a semiconductor device according to claim 1, and further comprising the step of encasing the semiconductor device in a housing.

14. The method for manufacturing an electronic device comprising the method for manufacturing a semiconductor device according to claim 2, and further comprising the step of encasing the semiconductor device in a housing.

15. The method for manufacturing an electronic device comprising the method for manufacturing a semiconductor device according to claim 4, and further comprising the step of encasing the semiconductor device in a housing.

16. A method for manufacturing a semiconductor device comprising the steps of:
forming a semiconductor layer over an insulating surface;
forming a gate insulating layer over the semiconductor layer;

forming a gate electrode layer over the semiconductor layer with the gate insulating layer provided therebetween;

forming an insulating layer over the gate electrode layer;

forming an opening reaching the semiconductor layer, by etching the insulating layer and the gate insulating layer;

forming a conductive film in the opening and on the insulating layer;

performing a polishing treatment on the conductive film so as to remove a part of the conductive film located over the insulating layer, thereby forming one of a source and a drain electrode layer from the conductive film, the one of the source and the drain electrode layer filling the opening; and forming a source or drain wiring layer on and in contact with the one of the source and the drain electrode layer, wherein a portion of the opening filled by the one of the source and the drain electrode layer does not overlap with the source or drain wiring layer.

17. The method for manufacturing a semiconductor device according to claim 16,
wherein only a portion of the conductive film located below a top surface of the insulating layer remains after the polishing treatment.

18. The method for manufacturing a semiconductor device according to claim 16,
wherein the semiconductor layer is an oxide semiconductor layer.

19. The method for manufacturing a semiconductor device according to claim 16,
wherein a chemical mechanical polishing treatment is used for the polishing treatment of the conductive film.

20. The method for manufacturing an electronic device comprising the method for manufacturing a semiconductor device according to claim 16, and further comprising the step of encasing the semiconductor device in a housing.

21. A method for manufacturing a semiconductor device comprising the steps of:
forming a semiconductor layer over an insulating surface;
forming a gate insulating layer over the semiconductor layer;
forming a gate electrode layer over the semiconductor layer with the gate insulating layer provided therebetween;

forming an insulating layer over the gate electrode layer;

forming a first opening and a second opening each reaching the semiconductor layer by etching the insulating layer and the gate insulating layer;

forming a conductive film simultaneously in the first opening, in the second opening, and on the insulating layer;

performing a polishing treatment on the conductive film so as to remove a part of the conductive film located over the insulating layer, thereby forming a source electrode layer and a drain electrode layer, the source electrode layer and the drain electrode layer filling respectively the first opening and the second opening, and the source electrode layer being separated from the drain electrode layer; and forming a source wiring layer and a drain wiring layer on and in contact with the source electrode layer and the drain electrode layer, respectively, wherein a portion of the first opening filled by the source electrode layer does not overlap with the source wiring layer, and wherein a portion of the second opening filled by the drain electrode layer does not overlap with the drain wiring layer.

22. The method for manufacturing a semiconductor device according to claim 21,
wherein a distance between the source wiring layer and the drain wiring layer is longer than a distance between the source electrode layer and the drain electrode layer, the distances being considered along a same straight line.

23. The method for manufacturing a semiconductor device according to claim 21,
wherein the semiconductor layer is an oxide semiconductor layer.

24. The method for manufacturing a semiconductor device according to claim 21,
wherein a chemical mechanical polishing treatment is used for the polishing treatment of the conductive film.

25. The method for manufacturing an electronic device comprising the method for manufacturing a semiconductor device according to claim 21, and further comprising the step of encasing the semiconductor device in a housing.

* * * * *